(12) United States Patent
Lee et al.

(10) Patent No.: US 11,695,032 B2
(45) Date of Patent: Jul. 4, 2023

(54) DISPLAY DEVICE

(71) Applicants: Samsung Display Co., Ltd., Yongin-si (KR); UNIST(ULSAN NATIONAL INSTITUTE OF SCIENCE AND TECHNOLOGY, Ulsan (KR)

(72) Inventors: Seongryong Lee, Hwaseong-si (KR); Thi Duyen Nguyen, Ulsan (KR); Jae-Kyoung Kim, Hwaseong-si (KR); Wonsang Park, Yongin-si (KR); Gangil Byun, Ulsan (KR); Eunjin Sung, Yongin-si (KR); Jinmyeong Heo, Suwon-si (KR)

(73) Assignees: Samsung Display Co., Ltd., Yongin-si (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 17/135,859

(22) Filed: Dec. 28, 2020

(65) Prior Publication Data
US 2021/0358996 A1    Nov. 18, 2021

(30) Foreign Application Priority Data
May 13, 2020  (KR) .................. 10-2020-0056992

(51) Int. Cl.
*H01L 27/15* (2006.01)
*H01Q 1/24* (2006.01)
(Continued)

(52) U.S. Cl.
CPC .......... *H01L 27/156* (2013.01); *G06F 3/0412* (2013.01); *G06F 3/0445* (2019.05);
(Continued)

(58) Field of Classification Search
CPC combination set(s) only.
See application file for complete search history.

(56) References Cited

U.S. PATENT DOCUMENTS 10,381,750 B2    8/2019  Jung et al.
10,622,703 B2    4/2020  Hong et al.
(Continued)

FOREIGN PATENT DOCUMENTS

KR    10-2015-0104509 A    9/2015
KR    10-2016-0080444 A    7/2016
(Continued)

OTHER PUBLICATIONS

Chen et al., "Spectral-Domain Moment-Method Analysis of Coplanar Microstrip Parasitic Subarrays", Microwave and Optical Technology Letters / vol. 6, No. 3, Mar. 5, 1993, 5 pages.
(Continued)

*Primary Examiner* — Deeprose Subedi
(74) *Attorney, Agent, or Firm* — Lewis Roca Rothgerber Christie LLP

(57) ABSTRACT

A display device includes a base layer, a display layer on the base layer and defined with a plurality of light emitting areas and a surrounding area, a sensing layer on the display layer, and an antenna layer on the display layer and including a plurality of antennas, wherein each of the plurality of antennas includes a first pattern configured to receive a signal, and a second pattern on the same layer as the first pattern, the second pattern being separated from the first pattern and grounded, and each of the first pattern and the second pattern has a mesh structure and overlaps the surrounding area.

20 Claims, 25 Drawing Sheets

(51) Int. Cl.
  *H01L 33/62* (2010.01)
  *G06F 3/041* (2006.01)
  *G06F 3/044* (2006.01)

(52) U.S. Cl.
  CPC ............ *H01L 33/62* (2013.01); *H01Q 1/243* (2013.01); *G06F 2203/04111* (2013.01); *G06F 2203/04112* (2013.01)

(56) References Cited

U.S. PATENT DOCUMENTS

| | | | |
|---|---|---|---|
| 2016/0190678 A1 | 6/2016 | Hong et al. | |
| 2019/0058264 A1* | 2/2019 | Jung | H01Q 9/0435 |
| 2019/0386400 A1* | 12/2019 | Wu | H01Q 5/371 |
| 2020/0227819 A1* | 7/2020 | Oh | H04M 1/026 |
| 2022/0029278 A1* | 1/2022 | Ryu | G09F 9/00 |

FOREIGN PATENT DOCUMENTS

| | | |
|---|---|---|
| KR | 10-2019-0019802 A | 2/2019 |
| KR | 10-2019-0069226 A | 6/2019 |

OTHER PUBLICATIONS

Nithisopa et al., "Design CPW Fed Slot Antenna for Wideband Applications", Piers Online, vol. 3, No. 7, 2007, 4 pages.

Norzeli et al., "Design of High Gain Microstrip Patch Reader Array Antenna with Parasitic Elements for UHF RFID Application", International Journal of Engineering & Technology, 7 (4.35) (2018) 463-467.

Reddy et al., "Bandwidth Enhancement of Microstrip Patch Antenna using Parasitic Patch", 2017 IEEE International Conference on Smart Technologies and Management for Computing, Communication, Controls, Energy and Materials (ICSTM), Veltech Dr.RR & Dr.SR University, Chennai, T.N., India. Aug. 2-4, 2017. pp. 295-298.

Tsai et al. "FDTD Analysis of CPW-Fed Folded-Slot and Multiple-Slot Antennas on Thin Substrates", IEEE Transactions on Antennas and Propagation, vol. 44, No. 2, Feb. 1996, 10 pages.

\* cited by examiner

DISPLAY DEVICE

CROSS-REFERENCE TO RELATED APPLICATIONS

This application claims priority to and the benefit of Korean Patent Application No. 10-2020-0056992, filed on May 13, 2020, the entire content of which is hereby incorporated by reference.

BACKGROUND

The present disclosure herein relates to a communicable display device.

A display device may include one or more electronic modules. For example, the display device may be a mobile terminal or a wearable device, and the electronic modules may include an antenna module, a camera module, and/or a battery module. According to thinning of the mobile terminal and miniaturization of the wearable device, a space in which the electronic modules are mounted is gradually decreased. In addition, as an electronic device becomes highly functionalized and is developed to high specification, the number of electronic modules included in the display device increases.

SUMMARY

Aspects of embodiments of the present disclosure are directed towards a thin-type display device (e.g., a thin kind of display device) including an antenna.

Aspects of embodiments of the present disclosure are also directed towards a display device from which an antenna is not viewed from the outside (e.g., an antenna that is not viewable from the outside or whose visibility from the outside is reduced).

Aspects of embodiments of the present disclosure are also directed towards a display device communicable in various suitable frequency bands.

An embodiment of the present disclosure provides a display device including: a base layer; a display layer on the base layer and defined with a plurality of light emitting areas and a surrounding area around the plurality of light emitting areas; a sensing (sensor) layer on the display layer and including a plurality of first sensing electrodes and a plurality of second sensing electrodes; and an antenna layer on the display layer and including a plurality of antennas, wherein each of the plurality of antennas includes a first pattern configured to receive a signal, and a second pattern on a same layer (e.g., a same layer level) as the first pattern, the second pattern being separated from the first pattern and grounded, wherein each of the first pattern and the second pattern has a mesh structure and overlaps the surrounding area.

In an embodiment, the first pattern may include a first pattern portion extending along a first direction and a second pattern portion extending along a second direction crossing the first direction.

In an embodiment, at least one of the plurality of antennas may further include a third pattern extending along the first direction, wherein the third pattern is arranged between the first pattern portion and the second pattern, and wherein the third pattern has a mesh structure.

In an embodiment, the first pattern portion may be defined with a first area and a second area separated from the first area in the first direction, and the plurality of antennas may include a first antenna and a second antenna, wherein the second pattern portion of the first antenna may extend from the first area of the first antenna, and the second pattern portion of the second antenna may extend from the second area of the second antenna.

In an embodiment, the sensing layer may further include a cover insulation layer configured to cover the plurality of first sensing electrodes and the plurality of second sensing electrodes, wherein the plurality of antennas may be on the cover insulation layer.

In an embodiment, the sensing layer may further include a planarization insulation layer on the cover insulation layer, wherein the plurality of antennas may be directly on the planarization insulation layer.

In an embodiment, the antenna layer may further include a dummy pattern separated from the plurality of antennas and on the cover insulation layer, wherein the dummy pattern has a mesh structure, and, in a plan view (e.g., when viewed from a thickness direction) of the display layer, overlaps the surrounding area and is separated from the plurality of light emitting areas.

In an embodiment, each of the plurality of first sensing electrodes may include: a plurality of sensing patterns; and a bridge pattern on a different layer (e.g., a different layer level) than a layer that the plurality of sensing patterns are on, and electrically coupled (e.g., electrically connected) to two adjacent sensing patterns among the plurality of sensing patterns, wherein the plurality of antennas are on a same layer as the bridge pattern.

In an embodiment, a layer, on which the plurality of sensing patterns are arranged, may be closer to the display layer than a layer, on which the bridge pattern is arranged, is to the display layer. For example, a distance between the layer that the plurality of sensing patterns are on and the display layer is less than a distance between the layer that the bridge pattern is on and the display layer.

In an embodiment, the antenna layer may include a dummy pattern separated from both the plurality of antennas and the bridge pattern, and wherein the dummy pattern is on the same layer as the bridge pattern.

In an embodiment, the sensing layer may further include: a plurality of sensing wirings electrically coupled (e.g., electrically connected) to the plurality of first sensing electrodes and the plurality of second sensing electrodes, respectively; and a plurality of sensing pads electrically coupled (e.g., electrically connected) to the plurality of sensing wirings, respectively, and the antenna layer may further include: a plurality of antenna wirings electrically coupled (e.g., electrically connected) with the plurality of antennas, respectively; and a plurality of antenna pads electrically coupled (e.g., electrically connected) to the plurality of antenna wirings, respectively.

In an embodiment, the base layer may include: a first base area overlapping the plurality of light emitting areas and the surrounding area; a second base area extending from a first edge portion of the first base area; and a third base area extending from the second base area, wherein the plurality of sensing pads and the plurality of antenna pads are on the third base area.

In an embodiment, the base layer may include a first base area overlapping the plurality of light emitting areas and the surrounding area; a second base area extending from a first edge portion of the first base area; a third base area extending from the second base area; a fourth base area extending from a second edge portion of the first base area different from the first edge portion of the first base area; and a fifth base area extending from the fourth base area, wherein the plurality of sensing pads are on the third base area and the plurality of antenna pads are on the fifth base area.

In an embodiment, each of the plurality of sensing wirings may be configured with a plurality of sensing conductive layers, and each of the plurality of antenna wirings may be configured with a single antenna conductive layer, wherein the single antenna conductive layer may be on the plurality of sensing conductive layers.

In an embodiment, each of the plurality of sensing wirings may be configured with a first sensing conductive layer and a second sensing conductive layer on the first sensing conductive layer, and each of the plurality of antenna wirings may be configured with a first antenna conductive layer on a same layer as the first sensing conductive layer, and a second antenna conductive layer on the first antenna conductive layer and on a same layer as the second sensing conductive layer.

In an embodiment, a thickness of each of the plurality of antennas may be greater than a thickness of each of the plurality of second sensing electrodes. For example, each of the plurality of antennas may be greater in thickness than each of the plurality of second sensing electrodes.

In an embodiment of the present disclosure, a display device includes: a display layer including a plurality of light emitting areas and a surrounding area around the plurality of light emitting areas; a sensing layer including a sensing electrode on the display layer and including a plurality of sensing patterns and a bridge pattern electrically coupled (e.g., electrically connected) to the plurality of sensing patterns, a sensing wiring electrically coupled (e.g., electrically connected) to the sensing electrode, and a sensing pad electrically coupled (e.g., electrically connected) to the sensing wiring; and an antenna layer including an antenna on the display layer and overlapping at least a portion of the plurality of sensing patterns, an antenna wiring electrically coupled (e.g., electrically connected) to the antenna, and an antenna pad electrically coupled (e.g., electrically connected) to the antenna wiring, wherein each of the antenna and the plurality of sensing patterns has openings, wherein the openings surround at least one of the plurality of light emitting areas in a plan view (e.g., when viewed from a thickness direction) of the display layer.

In an embodiment, each of the antennas may include a first pattern configured to receive a signal, and a second pattern on a same layer as the first pattern, the second pattern being separated from the first pattern and grounded, wherein the first pattern may include a first pattern portion extending along a first direction and a second pattern portion extending from the first pattern portion along a second direction crossing the first direction, wherein the first pattern portion may be defined with a first area and a second area separated from the first area in the first direction, wherein the antenna may be provided in plural, and the plurality of antennas may include a first antenna and a second antenna, wherein the second pattern portion of the first antenna extends from the first area of the first antenna, and the second pattern portion of the second antenna extends from the second area of the second antenna.

In an embodiment, the first antenna may further include a third pattern extending along the first direction, wherein the third pattern is arranged between the first pattern portion and the second pattern, and wherein the third pattern has a mesh structure.

In an embodiment, the antenna layer may further include a dummy pattern separated from the antenna, wherein the dummy pattern has a mesh structure and, in the plan view (e.g., when viewed from the thickness direction) of the display layer, overlaps the surrounding area and is separated from the plurality of light emitting areas.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
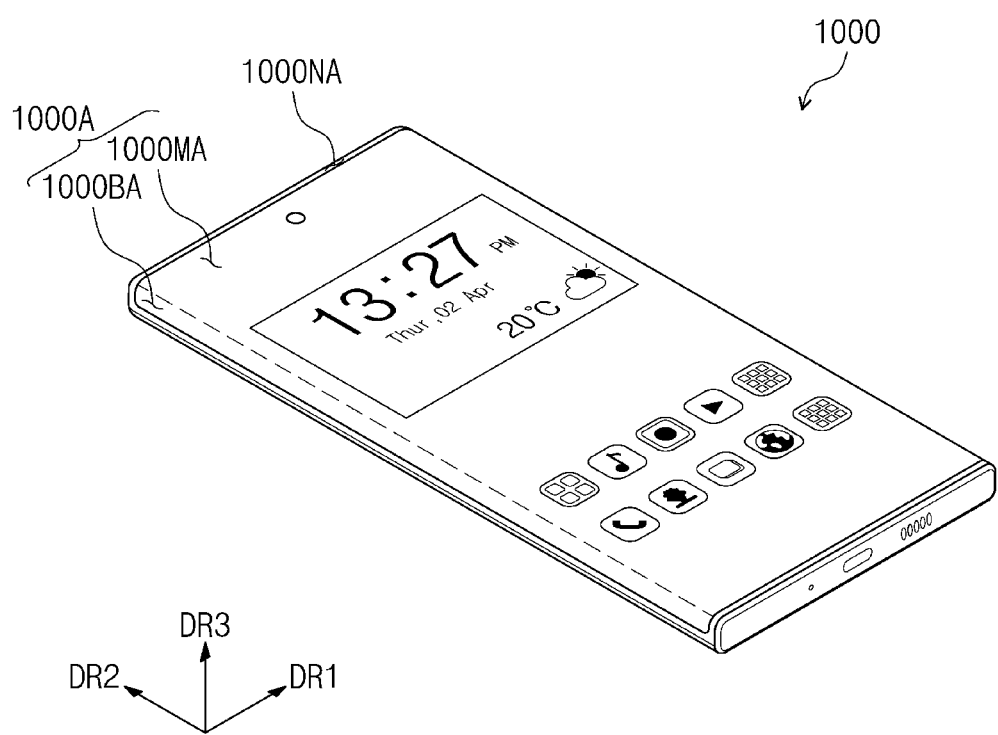
FIG. 1 is a perspective view of a display device according to an embodiment of the present disclosure.

It will be understood that when an element or layer is referred to as being "on," "connected to" or "coupled to" another element or layer, it can be directly on, directly connected to or directly coupled to the other element or layer, or an intervening third element(s) or layer(s) may be present. In contrast, when an element or layer is referred to as being "directly on," "directly connected to," or "directly coupled to" another element of layer, there are no intervening elements or layers present. As used herein, the use of the term "may," when describing embodiments of the present disclosure, refers to "one or more embodiments of the present disclosure."

Like reference numerals in the drawings refer to like elements. In addition, in the drawings, the thickness(es), the ratio(s), and the dimension(s) of the element(s) and layer(s) may be exaggerated for effective description of the technical contents.

The term "and/or" includes any and all combinations of one or more of the associated items.

Terms such as first, second, and the like may be used to describe various suitable components, but these components should not be limited by these terms. These terms are only used to distinguish one element from another. For instance, a first component may be referred to as a second component, or similarly, a second component may be referred to as a first component, without departing from the scope of the present disclosure. As used herein, the singular forms "a," "an," and "the" may include the plural forms as well, unless the context clearly indicates otherwise.

In addition, terms such as "under," "lower," "on," and "upper" are used for explaining associations and/or relations (e.g., spatial relations) of items illustrated in the drawings. It will be understood that these spatially relative terms are intended to encompass different orientations of the device in use or operation in addition to the orientation(s) depicted in the figures. As used herein, the terms "substantially," "about," "approximately," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and "including," when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the present disclosure will be described with reference to the accompanying drawings.

FIG. 1 is a perspective view of a display device (electronic device) according to an embodiment of the present disclosure.

Referring to FIG. 1, the display device 1000 may be a device activated according to an electrical signal. For example, the display device 1000 may be a mobile phone, a tablet PC, a vehicle navigator, a game device, or a wearable device, but is not limited thereto. In FIG. 1, the display device 1000 is illustrated as a mobile phone as an example.

The display device 1000 may be defined with (e.g., may have) a display area 1000A and a non-display area 1000NA. The non-display area 1000NA may be a surrounding area of the display area 1000A.

The display device 1000 may display an image through the display area 1000A. The display area 1000A may include a first display surface 1000MA, which is parallel (e.g., substantially parallel) to a surface defined by a first direction DR1 and a second direction DR2, and a second display surface 1000BA bent from the first display surface 1000MA.

The second display surface 1000BA may be provided to be bent from one side of the first display surface 1000MA. In some embodiments, the second display surface 1000BA may be provided in plural. In this case, the second display surface 1000BA may be provided to be bent from at least two sides of the first display surface 1000MA. The display area 1000A may include one first display surface 1000MA and one to four second display surfaces 1000BA. However, the shape of the display area 1000A is not limited thereto. For example, the display area 1000A may also include only the first display surface 1000MA.

A thickness direction of the display device 1000 may be parallel (e.g., substantially parallel) to a third direction DR3 that intersects with or crosses the first direction DR1 and the second direction DR2. Accordingly, front surfaces (or top surfaces) and rear surfaces (or bottom surfaces) of members composing (e.g., included in) the display device 1000 may be defined on the basis of the third direction DR3. The phrase, "in a plane view," "when viewed on a plane" and similar phrases may be defined as being viewed from the third direction DR3 of the display device 1000.

Figure 2:
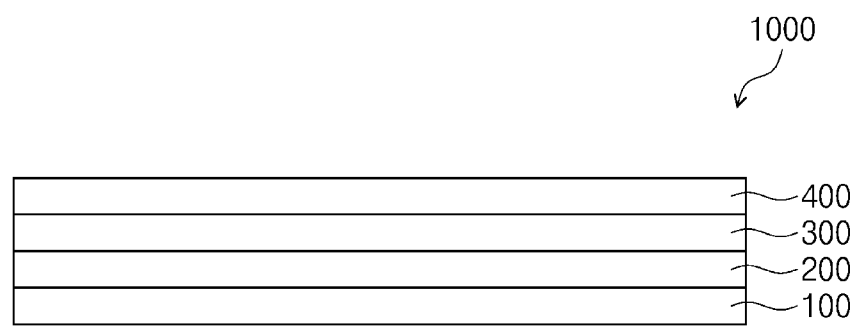
FIG. 2 is a schematic cross-sectional view of a display device according to an embodiment of the present disclosure.
Figure 2:
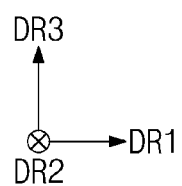

FIG. 2 is a schematic cross-sectional view of a display device according to an embodiment of the present disclosure.

Referring to FIG. 2, the display device 1000 may include a base layer 100, a display layer 200, a sensing layer 300, and an antenna layer 400.

The base layer 100 may include a synthetic resin layer. The synthetic resin layer may include (e.g., be) a thermo-setting resin. The base layer 100 may have a multi-layer structure. For example, the base layer 100 may have a three-layer structure of a synthetic resin layer, an adhesive layer, and a synthetic resin layer. At least one selected from among the synthetic resin layer(s) may include (e.g., be) at least one selected from among a polyimide-based resin, an acrylic-based resin, a methacrylic-based resin, polyisoprene, a vinyl-based resin, an epoxy-based resin, an urethane-based resin, a cellulose-based resin, a siloxane-based resin, a polyamide-based resin, and a perylene-based resin, but is not limited thereto. In some embodiments, the base layer 100 may include a glass substrate, an organic/inorganic composite material substrate, etc.

The display layer 200 may be disposed on the base layer 100. The display layer 200 may be a component for substantially generating an image. The display layer 200 may be an emissive display layer. For example, the display layer 200 may be an organic light emitting display layer, a quantum dot light emitting display layer, or a micro LED light emitting display layer. In some embodiments, the display layer 200 may be a transmissivity control layer for controlling the transmissivity of light provided from a backlight unit or the outside. For example, the display layer 200 may include (e.g., be) a liquid crystal molecule.

The sensing layer 300 may be disposed on the display layer 200. The sensing layer 300 may sense an external input applied from the outside. The external input may be a user input. The user input may include various suitable types (e.g., kinds) of external inputs including a part of the user's body (e.g., a touch from the part of the user's body), light, heat, a pen (e.g., a touch from the pen), pressure, and/or the like.

The sensing layer 300 may be disposed on the display layer 200 through a consecutive process (e.g., consecutive manufacturing processes). In this case, the sensing layer 300 may be directly disposed on the display layer 200. To be directly arranged (e.g., directly disposed on) refers to that a third element is not arranged between the sensing layer 300 and the display layer 200. For example, a separate adhesive member may not be arranged between the sensing layer 300 and the display layer 200.

The antenna layer 400 may be disposed on the sensing layer 300. The antenna layer 400 may transmit, receive, or transmit and receive a radio communication signal, for example, a radio frequency signal. The antenna layer 400 may be referred to as a radio frequency device. The antenna layer 400 may include a plurality of antennas (or a plurality of radiation parts), and the plurality of antennas may transmit, receive, or transmit and receive the same frequency band, or different frequency bands.

The antenna layer 400 may be composed on the sensing layer 300 through a consecutive process. For example, the antenna layer 400 may be directly disposed on the sensing layer 300. Accordingly, a third element may not be arranged between the antenna layer 400 and the sensing layer 300. According to the present disclosure, the display layer 200, the sensing layer 300, and the antenna layer 400 may be composed in a consecutive process, and one or more third elements may not be arranged between the display layer 200, the sensing layer 300, and the antenna layer 400. Accordingly, the transmissivity of the display device 100 may be improved, and the thin-type display device 1000 may be implemented.

The antenna layer 400 may be provided in the display area 1000A (see FIG. 1). Even when the display device 1000 is miniaturized or thinned, or the area of the non-display area 1000NA (see FIG. 1) surrounding the display area 1000A (see FIG. 1) is reduced, a space in which the antenna layer 400 is to be arranged may be easily secured (e.g., set) because the area of the display area 1000A is already secured (e.g., set).

The display device 1000 may further include a window. The window may include (e.g., be) an insulation material that is optically transparent. For example, the window may include (e.g., be) glass and/or plastic. The window may have a multilayer structure or a single-layer structure. For example, the window may include a plurality of plastic films bonded with an adhesive, or a glass substrate and a plastic film bonded with an adhesive.

Figure 3A:
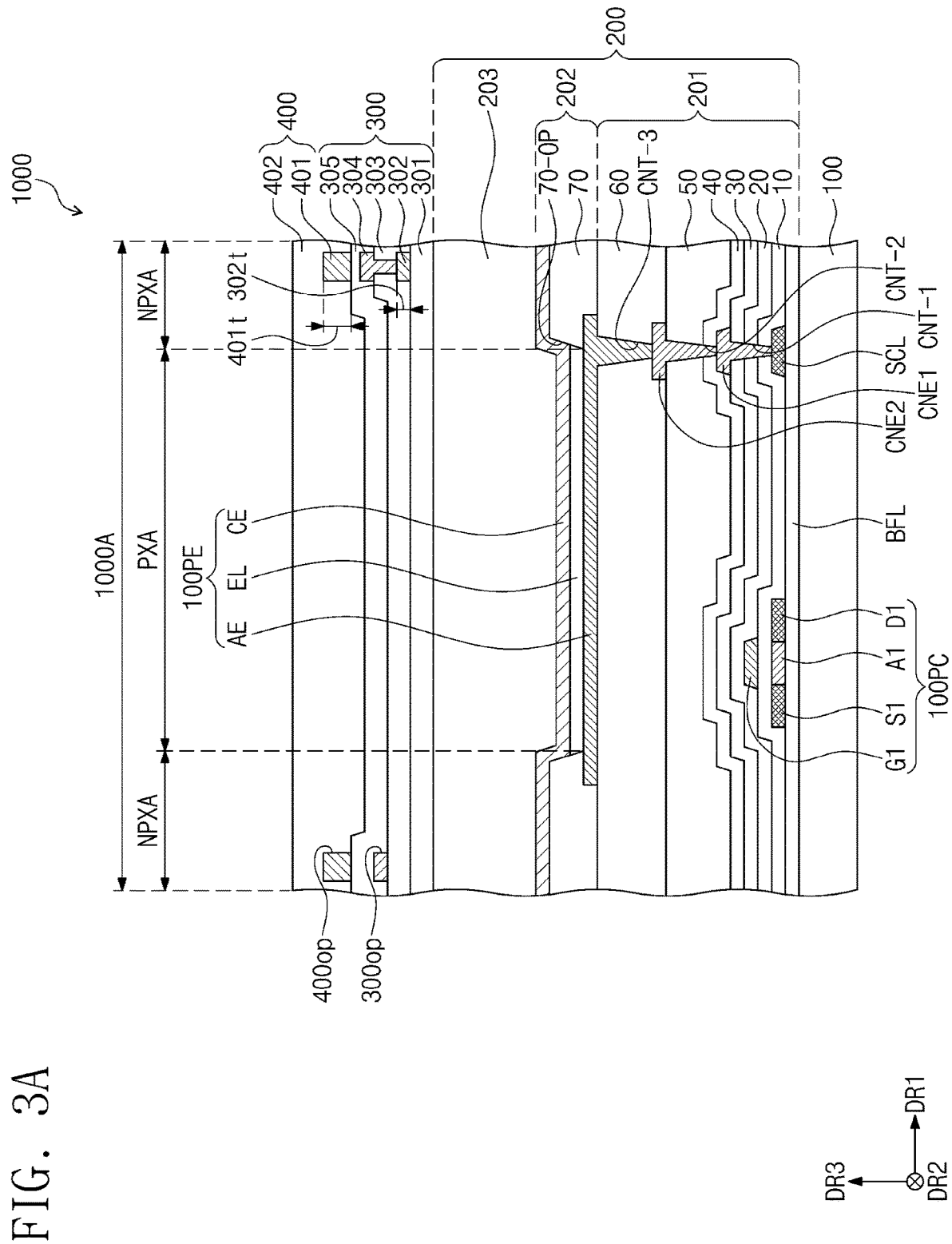
FIG. 3A is a cross-sectional view of a display device according to an embodiment of the present disclosure.

FIG. 3A is a cross-sectional view of a display device according to an embodiment of the present disclosure.

Referring to FIG. 3A, the display layer 200 may include a circuit layer 201, a light emitting element layer 202, and an encapsulation layer 203. The display layer 200 may include a plurality of insulation layers, a semiconductor pattern, a conductive pattern, a signal line, and the like. The insulation layers, the semiconductor layer, and the conductive layer may be composed (e.g., may be formed or manufactured) in a manner including coating, deposition, and/or the like. Then, the insulation layers, the semiconductor layer, and the conductive layer may be selectively patterned in a photolithography manner. In these manners, the semiconductor pattern, the conductive pattern, the signal line, and the like are composed, which are included in the circuit layer 201 or the light emitting element layer 202. Then, the encapsulation layer 203 for covering the light emitting element layer 202 may be composed.

At least one inorganic layer is composed on the top surface of the base layer 100. The inorganic layer may include (e.g., be) at least one selected from among aluminum oxides, titanium oxide, silicon oxide, silicon oxynitride, zirconium oxide, and hafnium oxide. The inorganic layer may be composed with multilayers. The multi-layered inorganic layer may compose (e.g., include) a barrier layer and/or a buffer layer. In the embodiment, the display layer 200 is illustrated to include a buffer layer BFL.

The buffer layer BFL may enhance the bonding force between the base layer 100 and the semiconductor pattern. The buffer layer BFL may include (e.g., be) a silicon oxide layer and a silicon nitride layer, and the silicon oxide layer and the silicon nitride layer may be alternately laminated. For example, the buffer layer BFL may include one or more silicon oxide layers and one or more silicon nitride layers, wherein the silicon oxide layers are alternately arranged in the third direction DR3 with the silicon nitride layers.

The semiconductor pattern may be disposed on the buffer layer BFL. The semiconductor pattern may include (e.g., be) polysilicon. However, an embodiment of the present disclosure is not limited thereto, and the semiconductor pattern may include (e.g., be) amorphous silicon and/or metal oxides.

FIG. 3A illustrates a portion of the semiconductor pattern, and another semiconductor pattern may be further arranged in another region. The semiconductor pattern may be arrayed in a set rule across pixels. The semiconductor pattern may have different electric properties according to whether it is to be doped or not. For example, the semiconductor pattern may include a plurality of regions having different electric properties depending on how the regions are doped. For example, the electric properties of a region of the plurality of regions may depend on whether the region is doped, the concentration of doping in the region, and the type of doping in the region. The semiconductor pattern may include a doped area or a non-doped area. The doped area may be doped with an N-type dopant or a P-type dopant. A P-type transistor includes a doped area doped with a P-type dopant, and an N-type transistor includes a doped area doped with an N-type dopant.

The doped area has larger conductivity than the non-doped area, and substantially plays a role (e.g., plays a substantial role) of an electrode or a signal line. The non-doped area substantially corresponds to an active area (or channel) of the transistor. For example, a part of the semiconductor pattern may be the active area of the transistor, another part may be the source or the drain, and another part may be a connection electrode or a signal connection line.

Each pixel may have an equivalent circuit including seven transistors, one capacitor, and a light emitting element, and the equivalent circuit of the pixel may be changed in various suitable types (e.g., kinds). However, the equivalent circuit is not limited thereto, and the equivalent circuit according to some embodiments may have any suitable number of transistors, capacitors, light emitting elements, and other electronic components. In FIG. 3A, one transistor 100PC and one light emitting element 100PE included in the pixel are illustrated as an example.

A source S1, an active area A1, and a drain D1 of the transistor 100PC may be composed from the semiconductor pattern. The source S1 and the drain D1 may extend from the active area A1 in opposite directions from each other in the cross sectional view. In FIG. 3A, a portion of a signal connection line SCL composed from the semiconductor pattern is illustrated. The signal connection line SCL may be coupled (e.g., connected) to the drain D1 of the transistor 100PC on a plane (e.g., in a plan view or along a plane).

A first insulation layer 10 may be disposed on the buffer layer BFL. The first insulation layer 10 may commonly overlap the plurality of pixels and cover the semiconductor pattern. The first insulation layer 10 may include (e.g., be) an inorganic material and/or organic material, and have a single layer or multilayer structure. The first insulation layer 10 may include (e.g., be) at least one selected from among aluminum oxides, titanium oxide, silicon oxide, silicon oxynitride, zirconium oxide, and hafnium oxide. In the present embodiment, the first insulation layer 10 may be a silicon oxide layer of a single layer. Not only the first insulation layer 10, but also the insulation layer of the circuit layer 201, which will be described later, may include (e.g., be) an inorganic material and/or organic material, and may have a single layer or multilayer structure. The inorganic layer may include (e.g., be) at least one selected from among the aforementioned materials, but is not limited thereto.

A gate G1 of the transistor 100PC may be disposed on the first insulation layer 10. The gate G1 may be a portion of a metal pattern. The gate G1 may overlap the active area A1. The gate G1 may function as a mask in a process for doping the semiconductor pattern.

A second insulation layer 20 may be disposed on the first insulation layer 10 and may cover the gate G1. The second insulation layer 20 may commonly overlap the pixels. The second insulation layer 20 may include (e.g., be) an inorganic material and/or organic material, and may have a single layer or multilayer structure. In the present embodiment, the second insulation layer 20 may be a silicon oxide layer of a single layer.

A third insulation layer 30 may be disposed on the second insulation layer 20, and the third insulation layer 30 in the present embodiment may be a single silicon oxide layer. A first connection electrode CNE1 may be disposed on the third insulation layer 30. The first connection electrode CNE1 may be coupled (e.g., connected) to a signal connection line SCL through a contact hole CNT-1 penetrating through the first to third insulation layers 10, 20, and 30.

A fourth insulation layer 40 may be disposed on the third insulation layer 30. The fourth insulation layer 40 may be a single silicon oxide layer. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be coupled (e.g., connected) to the first connection electrode CNE1 through a contact hole CNT-2 penetrating through the fourth insulation layer 40 and the fifth insulation layer 50.

A sixth insulation layer 60 may be disposed on the fifth insulation layer 50 and cover the second connection electrode CNE2. The sixth insulation layer 60 may be an organic layer.

The light emitting element layer 202 may include the light emitting element 100PE and may be disposed on the circuit layer 201. The light emitting element 100PE may include a first electrode AE, an emissive layer EL, and a second electrode CE.

The first electrode AE may be disposed on the sixth insulation layer 60. The first electrode AE is coupled (e.g., connected) to the second connection electrode CNE2 through a contact hole CNT-3 penetrating through the sixth insulation layer 60.

A pixel definition layer 70 may be disposed on the sixth insulation layer 60 and cover a portion of the first electrode AE (e.g., a side or edge of the first electrode AE). The pixel definition layer 70 is defined with an opening part 70-OP. The opening part 70-OP of the pixel definition layer 70 exposes at least a portion of the first electrode AE (e.g., a center portion of the first electrode AE).

As shown in FIG. 3A, the display layer 200 may be defined with a light emitting area PXA and a surrounding area NPXA adjacent to the light emitting area PXA. In the present embodiment, the light emitting area PXA is defined in correspondence to a partial area of the first electrode AE exposed by the opening part 70-OP. For example, the light emitting area PXA may overlap (e.g., partially or entirely overlap) the opening part 70-OP in a plan view (e.g., in a thickness direction of the display device 1000). The light emitting area PXA may be provided in plural, and the surrounding area NPXA may surround (e.g., partially or entirely surround) the plurality of light emitting areas PXA. Both the light emitting area PXA and the surrounding area NPXA may be defined in the display area 1000A of the display device 1000.

The emissive layer EL may be disposed on the first electrode AE. The emissive layer EL may be disposed on an area corresponding to the opening part 70-OP. For example, the emissive layer EL may be separately disposed in each of the plurality of pixels. When the emissive layers EL are separately composed in the respective pixels, each emissive layer EL may emit light of one color from among blue, red, and green. However, the present disclosure is not limited thereto, and the emissive layer EL may be coupled (e.g., connected) to the pixels and commonly provided. In this case, the emissive layer EL may provide blue light, or white light.

The second electrode CE may be disposed on the emissive layer EL. The second electrode CE may have an integrated shape, and be commonly arranged to the plurality of pixels.

A hole control layer may be arranged between the first electrode AE and the emissive layer EL. The hole control layer may be commonly disposed on the light emitting area PXA and the surrounding area NPXA. The hole control layer may include a hole transport layer, and may further include a hole injection layer. An electron control layer may be arranged between the emissive layer EL and the second electrode CE. The electron control layer may include an electron transport layer, and may further include an electron injection layer. The hole control layer and the electron control layer may be commonly provided to the plurality of pixels utilizing (e.g., using) an open mask.

The encapsulation layer 203 may be disposed on the light emitting element layer 202. The encapsulation layer 203 may include an inorganic layer, an organic layer, and an inorganic layer that are sequentially laminated, but the layers providing the encapsulation layer 203 are not limited thereto. The inorganic layers may protect the light emitting element layer 202 from moisture and/or oxygen, and the organic layer may protect the light emitting element layer 202 from a foreign matter such as a dust particle. The inorganic layers may include a silicon nitride layer, a silicon oxynitride layer, a silicon oxide layer, a titanium oxide layer, and/or an aluminum oxide layer, but is not limited thereto. The organic layer may include an acrylic-based inorganic layer, but is not limited thereto.

The sensing layer 300 may include a base insulation layer 301, a first sensing conductive layer 302, a sensing insulation layer 303, a second sensing conductive layer 304, and a cover insulation layer 305.

The base insulation layer 301 may be an inorganic layer including (e.g., being) at least one selected from among silicon nitride, silicon oxynitride, and silicon oxide. In some embodiments, the base insulation layer 301 may be an organic layer including (e.g., being) an epoxy resin, an acrylic resin, and/or an imide-based resin. The base insulation layer 301 may have a single layer structure, or a multilayer structure laminated along the third direction DR3.

Each of the first sensing conductive layer 302 and the second sensing conductive layer 304 may have a single-layer structure or a multilayer structure laminated along the third direction DR3.

The conductive layer of the single layer structure may include a metal layer and/or a transparent conductive layer. The metal layer may include (e.g., be) molybdenum, silver, titanium, copper, aluminum, and an alloy thereof. The transparent conductive layer may include (e.g., be) a transparent conductive oxide such as indium tin oxide (ITO), indium zinc oxide (IZO), zinc oxide (ZnO), and/or indium zinc tin oxide (IZTO). In some embodiments, the transparent conductive layer may include (e.g., be) a conductive polymer such as PEDOT, a metal nano-wire, or graphene.

The conductive layer of the multilayer structure may include metal layers. For example, the conductive layer of the multilayer structure may have a three-layer structure of titanium/aluminum/titanium. The conductive layer of the multi-layered structure may include at least one metal layer and at least one transparent conductive layer.

The sensing layer 300 may acquire information about an external input through a change in mutual capacitance, or a change in self-capacitance. For example, the sensing layer 300 may include a plurality of sensing electrodes 310 and 320 (see FIG. 4). Each of the plurality of sensing electrodes 310 and 320 may be composed of patterns included in the first sensing conductive layer 302 and/or the second sensing conductive layer 304.

At least one selected from among the sensing insulation layer 303 and the cover insulation layer 305 may include an inorganic film. The inorganic film may include (e.g., be) at least one selected from among aluminum oxide, titanium oxide, silicon oxide, silicon oxynitride, zirconium oxide, and hafnium oxide.

In some embodiments, at least one selected from among the sensing insulation layer 303 and the cover insulation layer 305 may include an organic film. The organic film may include (e.g., be) at least one selected from among acrylic-based resin, a methacrylic-based resin, polyisoprene, a vinyl-based resin, an epoxy-based resin, an urethane-based resin, a cellulose-based resin, a siloxane-based resin, a polyimide-based resin, a polyamide resin, and a parylene-based resin.

The antenna layer 400 may include an antenna conductive layer 401 and an antenna insulation layer 402.

The antenna conductive layer 401 may have a single layer structure, or a multilayer structure laminated along the third direction DR3. The antenna conductive layer 401 may include (e.g., be) the same material as the first sensing conductive layer 302 or the second sensing conductive layer 304. For example, the antenna conductive layer 401 may include (e.g., be) a material selected from among the materials that the first sensing conductive layer 302 or the second sensing conductive layer 304 may include.

Figure 4:
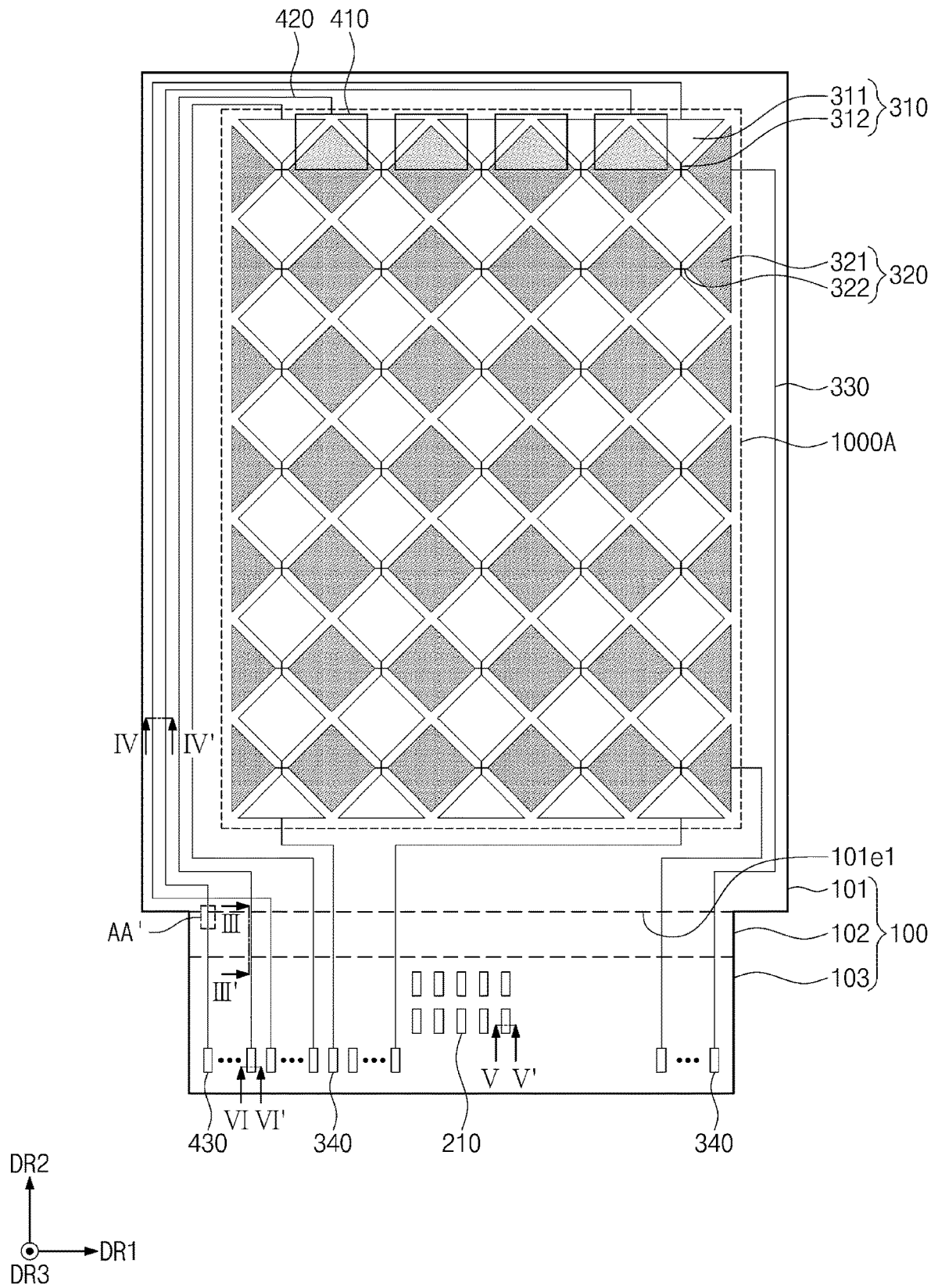
FIG. 4 is a plan view illustrating some components of a display device according to an embodiment of the present disclosure.

The antenna conductive layer 401 may include a plurality of antennas 410 (see FIG. 4). Accordingly, the plurality of antennas 410 may be directly disposed on the cover insulation layer 305. The bottom surface of the plurality of antennas 410 may directly contact the top surface of the cover insulation layer 305, or the top surface of the sensing layer 300.

The thickness 401t of the antenna conductive layer 401 may be greater than each of those (e.g., than each of the respective thicknesses) of the first sensing conductive layer 302 and the second sensing conductive layer 304. For example, the thickness 401t of the antenna conductive layer 401 may be 1.3 times to double (2.0 times) the thickness 302t of the first sensing conductive layer 302. For example, the thickness 302t of the first sensing conductive layer 302 may be about 2500 Å to about 3000 Å, and the thickness 401t of the antenna conductive layer 401 may be about 4000 Å to 6000 Å. As used herein, the term Å may refer to a distance equal to $10^{-10}$ meters. Accordingly, under a condition that the areas (e.g., planar areas) are the same (e.g., that the planar areas of the antenna conductive layer 401 and the first sensing conductive layer 302 are the same) in a plan view (e.g., when viewed on a plane), the resistance of the antenna conductive layer 401 may be smaller than that of the first sensing conductive layer 302.

The antenna insulation layer 402 may cover the antenna conductive layer 401 and may provide a planar surface to the top surface (e.g., top surface of the antenna insulation layer 402 or of the antenna layer 400). The antenna insulation layer 402 may include an organic film. The organic film may include at least one selected from among an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide resin, and a parylene-based resin.

Openings 300op and 400op may be defined in the first sensing conductive layer 302, the second sensing conductive layer 304, and the antenna conductive layer 401. For example, the openings 300op provided to (e.g., in) the second sensing conductive layer 304 may be openings provided to the plurality of sensing electrodes 310 and 320 (see FIG. 4), and the openings 400op provided to the antenna conductive layer 401 may be openings provided to the plurality of antennas 410 (see FIG. 4).

When viewed from the thickness direction (e.g., when viewed in a plan view) of the display layer 200, for example, from the third direction DR3, the openings 300op and 400op may surround (e.g., overlap) the light emitting area PXA. For example, in some embodiments, the openings 300op and 400op may overlap the light emitting area PXA in a plan view and may overlap at least a part of the surrounding area NPXA. For example, when viewed from the thickness direction (e.g., the third direction DR3) of the display layer 200, the conductive patterns respectively included in the first sensing conductive layer 302, the second sensing conductive layer 304, and the antenna conductive layer 401 may overlap the surrounding area NPXA, and may be separated (e.g., spaced apart) from the light emitting area PXA.

Figure 3B:
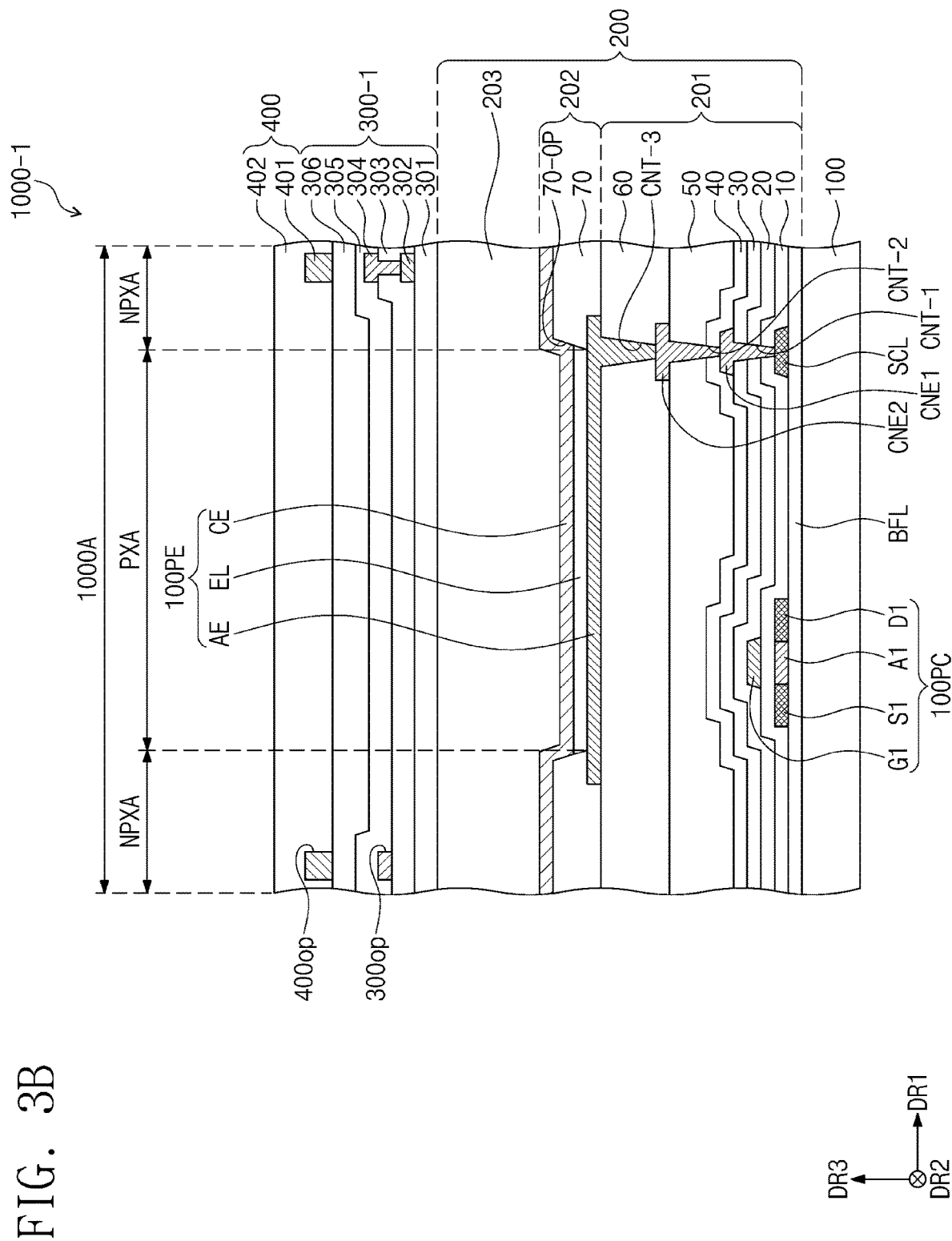
FIG. 3B is a cross-sectional view of a display device according to an embodiment of the present disclosure.

FIG. 3B is a cross-sectional view of a display device according to an embodiment of the present disclosure.

Referring to FIG. 3B, the display device 1000-1 may include the base layer 100, the display layer 200, a sensing layer 300-1, and the antenna layer 400.

The sensing layer 300-1 may include the base insulation layer 301, the first sensing conductive layer 302, the sensing insulation layer 303, the second sensing conductive layer 304, the cover insulation layer 305, and a planarization insulation layer 306.

The planarization insulation layer 306 may cover the cover insulation layer 305, and may provide a planar surface to the top surface (e.g., top surface of the planarization insulation layer 306 or of the sensing layer 300-1). The planarization insulation layer 306 may include an organic film.

The antenna conductive layer 401 may include a plurality of antennas 410 (see FIG. 4). Accordingly, the plurality of antennas 410 may be directly disposed on the planarization insulation layer 306. The bottom surface of the plurality of antennas 410 may directly contact the top surface of the planarization insulation layer 306, or the top surface of the sensing layer 300-1.

FIG. 4 is a plan view illustrating some components of a display device according to an embodiment of the present disclosure.

Referring to FIGS. 3A and 4, a first base area 101, a second base area 102, and a third base area 103 may be defined in the base layer 100. The first base area 101 may be an area overlapping the light emitting area PXA and the surrounding area NPXA illustrated in FIG. 3A. In addition, the first base area 101 may be an area overlapping the display area 1000A of the display device 1000 (see FIG. 1).

The second base area 102 may extend from a first edge portion 101e1 of the first base area 101. The third base area 103 may extend from the second base area 102. For example, the second base area 102 may be between the first base area 101 and the third base area 103.

The second base area 102 may be an area bent towards the rear surface of the first base area 101 in a process for assembling the display device 1000 (see FIG. 1) later. Accordingly, the third base area 103 may be disposed on (e.g., may overlap in the third direction DR3 or in the plan view) the rear surface of the first base area 101 in the display device 1000.

The sensing layer 300 may include a plurality of first sensing electrodes 310 (hereinafter, first sensing electrodes), a plurality of second sensing electrodes 320 (hereinafter, second sensing electrodes), and a plurality of sensing pads 340 (hereinafter, sensing pads).

The first sensing electrodes 310 and the second sensing electrodes 320 may be arranged in the display area 1000A. The sensing layer 300 may acquire information about an external input through a change in the mutual capacitance between the first sensing electrodes 310 and the second sensing electrodes 320.

The first sensing electrodes 310 may be arrayed separately in the first direction DR1. For example, the first sensing electrodes 310 may be arranged with each other along the first direction DR1. Each of the first sensing electrodes 310 may extend along the second direction DR2. The second sensing electrodes 320 may be arrayed separately in the second direction DR2. For example, the second sensing electrodes 320 may be arranged with each other along the second direction DR2. Each of the second sensing electrodes 320 may extend along the first direction DR1.

Each of the first sensing electrodes 310 may include a plurality of sensing patterns 311 and a bridge pattern 312 electrically coupled (e.g., electrically connected) to two adjacent sensing patterns 311 among the plurality of sensing patterns 311. For example, the bridge pattern 312 of a first sensing electrode 310 among the first sensing electrodes 310 may electrically couple (e.g., electrically connect) each pair of two adjacent sensing patterns 311 of the first sensing electrode 310.

The plurality of sensing patterns 311 and the bridge pattern 312 may be disposed on different layers. For example, when the bridge pattern 312 is included in the first sensing conductive layer 302, the plurality of sensing patterns 311 may be included in the second sensing conductive layer 304. In some embodiments, when the bridge pattern 312 is included in the second sensing conductive layer 304, the plurality of sensing patterns 311 may be included in the first sensing conductive layer 302.

Each of the second sensing electrodes 320 may include a plurality of first portions 321 and a second portion 322 defined between adjacent first portions 321 among the plurality of first portions 321. The first portions 321 may be referred to as sensing portions, and the second portion 322 may be referred to as a connection portion or a crossing portion.

The first portions 321 and the second portion 322 may be coupled (e.g., connected) to each other to have an integrated shape. For example, the second portion 322 of a second sensing electrode 320 among the second sensing electrodes 320 may electrically couple (e.g., electrically connect) each pair of two adjacent first portions 321 of the second sensing electrode 320. Accordingly, the second portion 322 may be defined as a portion crossing the bridge pattern 312 in each of the second sensing electrodes 320. The first portions 321 and the second portion 322 may be disposed on the same layer, and the first portions 321 and the second portion 322 may be disposed on the same layer as the plurality of sensing patterns 311.

Each of the first sensing electrodes 310 and the second sensing electrodes 320 may be electrically coupled (e.g., electrically connected) to at least one among sensing wirings 330. For example, one first sensing electrode 310 may be coupled (e.g., connected) to two sensing wirings 330. One sensing wiring 330 may be electrically coupled (e.g., electrically connected) to one end of the first sensing electrode 310, and another sensing wiring 330 may be electrically coupled (e.g., electrically connected) to the other end of the first sensing electrode 310. One sensing wiring 330 may be electrically coupled (e.g., electrically connected) to one second sensing electrode 320 (e.g., to one end of the second sensing electrode 320). However, the coupling relationships (e.g., connection relationships) of the sensing wirings 330 with respect to the first sensing electrodes 310 and the second sensing electrodes 320 are not limited to the illustrated examples.

The sensing pads 340 may be respectively electrically coupled (e.g., electrically connected) to the sensing wirings 330. The sensing pads 340 may be disposed on the third base area 103.

The antenna layer 400 may include a plurality of antennas 410 (hereinafter, antennas), a plurality of antenna wirings 420 (hereinafter, antenna wirings), and a plurality of antenna pads 430 (hereinafter, antenna pads). Although FIG. 4 illustrates four antennas 410 as an example, the number of antennas included in the display device 1000 (see FIG. 1) is not limited thereto.

Each of the antennas 410 may be included in the antenna conductive layer 401. The antennas 410 may be arranged in the display area 1000A. Accordingly, each of the antennas 410 may overlap a portion of the first sensing electrodes 310 and/or a portion of the second sensing electrodes 320.

The antenna wirings 420 may be respectively electrically coupled (e.g., electrically connected) to the antennas 410. The antenna pads 430 may be respectively electrically coupled (e.g., electrically connected) to the antenna wirings 420. The antenna pads 430 may be disposed on the third base area 103.

Driving chip pads 210 may be further disposed on the third base area 103. A driving chip may be electrically coupled (e.g., electrically connected) to the driving chip pads 210. For example, the driving chip may be mounted on the base layer 100. However, this is an example, and the driving chip pads 210 may be omitted according to some embodiments. In this case, pads to which a film with the driving chip mounted thereon is electrically coupled (e.g., electrically connected) may be further provided.

Figure 5:
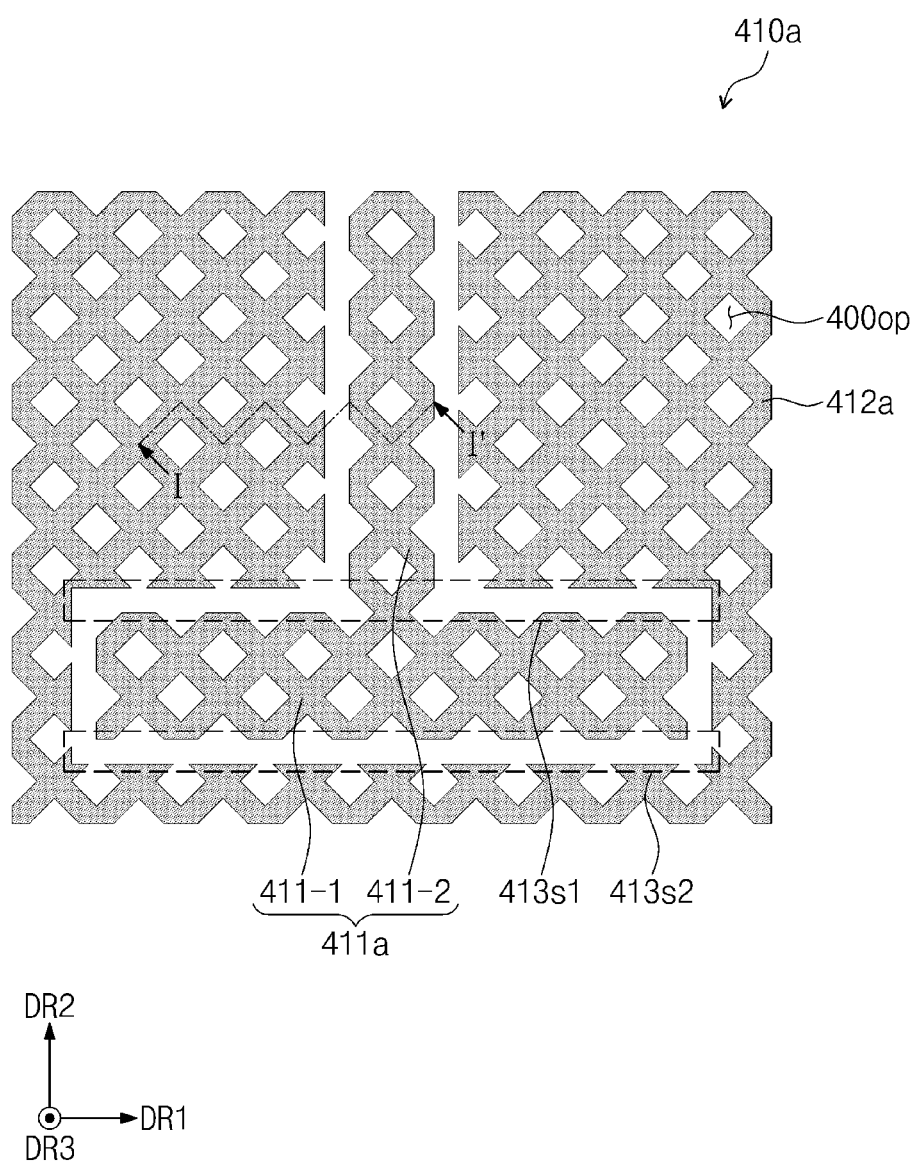
FIG. 5 is a plan view of an antenna according to an embodiment of the present disclosure.

FIG. 5 is a plan view of an antenna according to an embodiment of the present disclosure.

Referring to FIGS. 3A, 4, and 5, one antenna 410a is enlarged and illustrated in FIG. 5. The antenna 410a may include a first pattern 411a and a second pattern 412a. The first pattern 411a is a component to which a signal is input (or delivered), and the second pattern 412a may be a grounded component. The first pattern 411a and the second pattern 412a may contain (e.g., include or be) the same material, and may be disposed on the same layer. For example, each of the first pattern 411a and the second pattern 412a may be a component included in the antenna conductive layer 401 (see FIG. 3A). For example, the antenna 410a may be a coplanar waveguide (CPW) feeding slot antenna for which feeding is performed on the same plane.

The second pattern 412a may be separated from the first pattern 411a. For example, the second pattern 412a may be spaced apart from the first pattern 411a in a plan view. A slot may be defined between the first pattern 411a and the second pattern 412a. A signal provided to the antenna 410a may be radiated to the outside through the slot. The slot may include a first slot portion 413s1 and a second slot portion 413s2. Each of the first slot portion 413s1 and the second slot portion 413s2 may be defined as a portion extending along the first direction DR1.

One of conductive layers arranged under the first pattern 411a and the second pattern 412a may function as a lower ground layer of the antenna 410a. The lower ground layer may play a role of shielding a signal, which is radiated between (and/or from both) the first pattern 411a and the second pattern 412a, from facing the display layer 200. For example, the lower ground layer may shield the display layer 200 from the signal. The second pattern 412a may not contact the lower ground layer. For example, the second electrode CE included in the display layer 200 may function as the lower ground layer, but is not particularly limited thereto. The distance (e.g., the distance along the third direction DR3) between the lower ground layer and the antenna 410a may be about 0.01 mm. As used herein, the term mm may refer to a distance of $10^{-3}$ meters. For example, the distance between the second electrode CE and the antenna conductive layer 401 may be about 0.01 mm, but is not limited thereto.

Each of the first pattern 411a and the second pattern 412a may have a mesh structure (e.g., a structure having a mesh shape). Accordingly, the opening 400op may be defined in each of the first pattern 411a and the second pattern 412a. For example, the opening 400op may be defined in an area overlapping the light emitting area PXA, and each of the first pattern 411a and the second pattern 412a may overlap the surrounding area NPXA.

The first pattern 411a may include a first pattern portion 411-1 and a second pattern portion 411-2. The first pattern portion 411-1 extends along the first direction DR1, and the second pattern portion 411-2 may extend from the first pattern portion 411-1 along the second direction DR2. The second pattern portion 411-2 may be a portion coupled (e.g., connected) to the antenna wiring 420 and may be referred to as a feeding line. The first pattern portion 411-1 may be a portion extending from the second pattern portion 411-2 and may be referred to as a stub.

Figure 6:
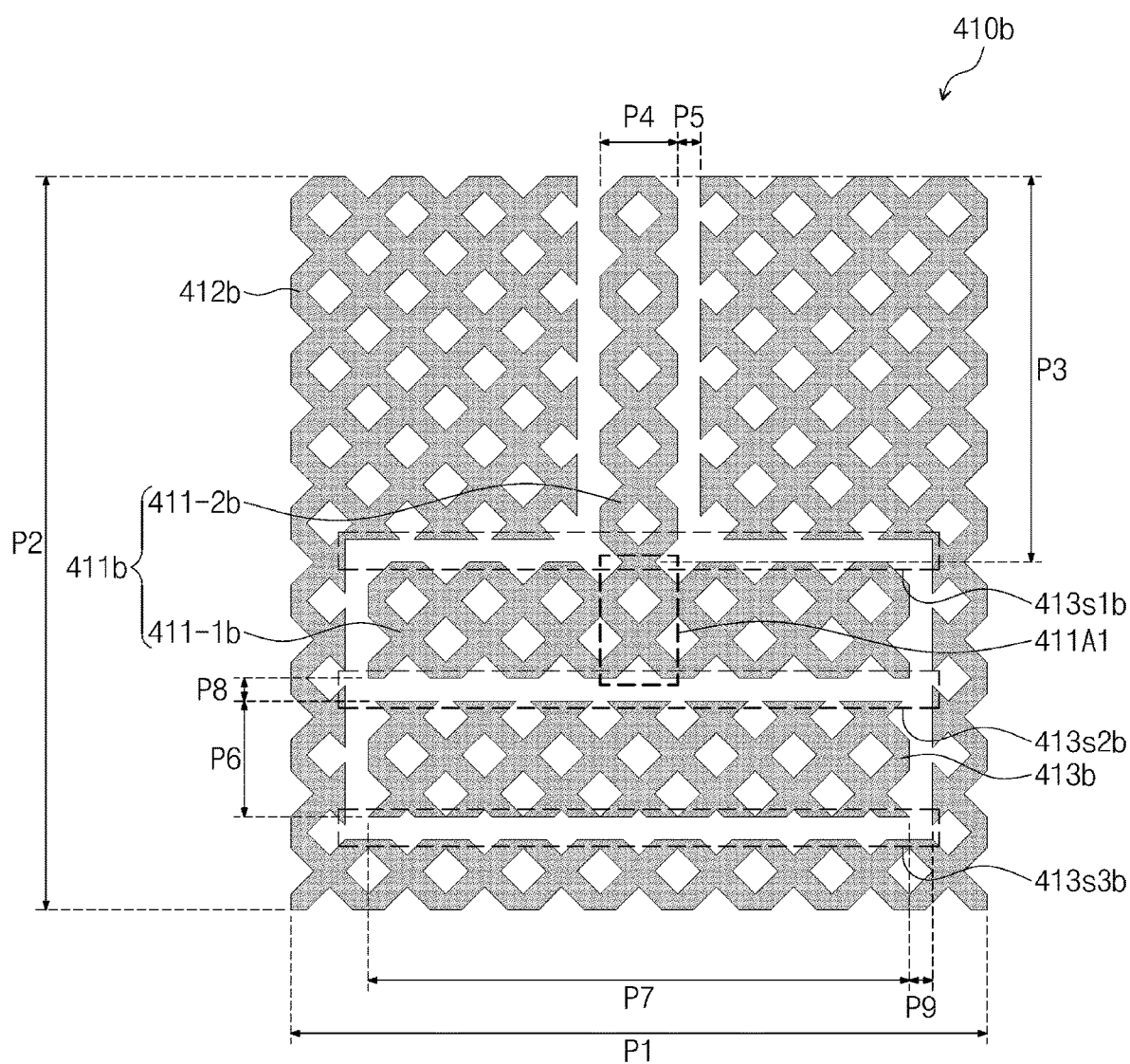
FIG. 6 is a plan view of an antenna according to an embodiment of the present disclosure.

FIG. 6 is a plan view of an antenna according to an embodiment of the present disclosure.

Referring to FIGS. 3A, 4, and 6, one antenna 410b is enlarged and illustrated in FIG. 6. The antenna 410b may include a first pattern 411b, a second pattern 412b, and a third pattern 413b. Each of the first pattern 411b, the second pattern 412b, and the third pattern 413b may have a mesh structure (e.g., a structure having a mesh shape).

The first pattern 411b may include a first pattern portion 411-1b and a second pattern portion 411-2b. The first pattern portion 411-1b extends along the first direction DR1, and the second pattern portion 411-2b may extend from the first pattern portion 411-1b along the second direction DR2.

The third pattern 413b may be arranged between the first pattern 411b and the second pattern 412b. For example, the third pattern 413b may be arranged between the first pattern portion 411-1b and the second pattern 412b. The third pattern 413b may extend along the first direction DR1.

A slot may be defined between the first pattern 411b, the second pattern 412b, and the third pattern 413b. For example, the first pattern 411b, the second pattern 412b, and the third pattern 413b may be spaced apart from each other in a plan view by the slot. A signal provided to the antenna 410b may be radiated to the outside through the slot. The slot may include a first slot portion 413s1b, a second slot portion 413s2b, and a third slot portion 413s3b. Each of the first slot portion 413s1b, the second slot portion 413s2b, and the third slot portion 413s3b may be extend along the first direction DR1.

The shape of the antenna 410b may be designed on the basis of set values. For example, the shape of the antenna 410b may be based on set values of dimensions of the antenna 410b and of the components of the antenna 410b (e.g., the first pattern 411b, the second pattern 412b, the third pattern 413b, the slot, etc.). The resonant frequency of the antenna 410b and the impedance of the antenna 410b may be adjusted by controlling the set values.

First to ninth values P1, P2, P3, P4, P5, P6, P7, P8, and P9 are indicated in FIG. 6. The first value P1 is the width in the first direction DR1 of the antenna 410b, and the second value P2 is the length in the second direction DR2 of the antenna 410b. The first value P1 may be designed to be about 4.8 mm, and the second value P2 may be designed to be about 7.465 mm.

The third value P3 may be the length in the second direction DR2 of the second pattern portion 411-2b, the fourth value P4 is the width in the first direction DR1 of the second pattern portion 411-2b, and the fifth value P5 is the interval between the second pattern portion 411-2b and the second pattern 412*b*. The third value P3 may be designed to be about 1.86 mm, the fourth value P4 may be designed to be about 0.025 mm, and the fifth value P5 may be designed to be about 0.02 mm.

The sixth value P6 is the width in the second direction DR2 of each of the third pattern 413*b* and the first pattern portion 411-1*b*, and the seventh value P7 is the length in the first direction DR1 of each of the third pattern 413*b* and the first pattern portion 411-1*b*. For example, the third pattern 413*b* may have the same (e.g., substantially the same) width and length as the first pattern portion 411-1*b*. The eighth value P8 is a minimum width in the second direction DR2 of the slot, and the ninth value P9 is a minimum width in the first direction DR1 of the slot. For example, the eighth value P8 may be a distance (e.g., a distance along the second direction DR2) between the first pattern portion 411-1*b* and the third pattern 413*b*, and the ninth value P9 may be a distance (e.g., a distance along the first direction DR1) between the second pattern 412*b* and one or both of the first pattern portion 411-1*b* and the third pattern 413*b*. The sixth value P6 may be designed to be about 0.025 mm, the seventh value P7 may be designed to be about 2.8 mm, and each of the eighth value P8 and the ninth value P9 may be designed to be about 0.03 mm.

The permittivity between the antenna 410*b* and the lower ground layer is $\varepsilon_r=3.13$, tan $\delta=0.001$, and the distance between the antenna 410*b* and the lower ground layer may be designed to be about 0.01 mm.

Figure 7:
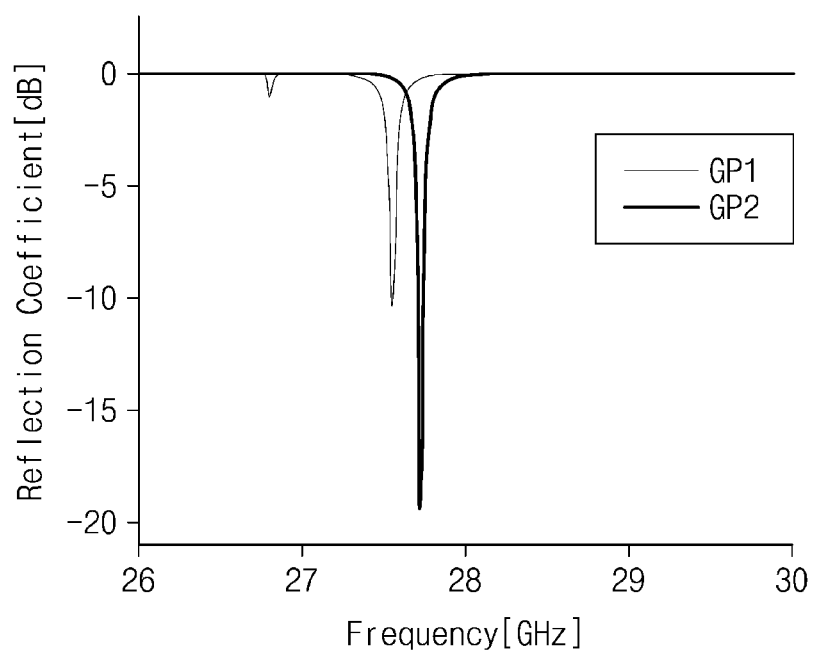
FIG. 7 shows graphs representing reflection coefficients according to a frequency.

FIG. 7 shows graphs representing reflection coefficients according to a frequency.

Referring to FIGS. 5, 6, and 7, a first graph GP1 represents a reflection coefficient of the antenna 410*a* shown in FIG. 5 according to a frequency, and a second graph GP2 represents a reflection coefficient of the antenna 410*b* shown in FIG. 6 according to a frequency.

The shape of the first pattern 411*a* of the antenna 410*a* may be the same as the shape of the first pattern 411*b* of the antenna 410*b*. As the antenna 410*b* further includes the third pattern 413*b*, the third slot portion 413*s*3*b* may be further defined in comparison to the antenna 410*a*. For example, the antenna 410*b* may include the first, second, and third slot portions 413*s*1*b*, 413*s*2*b*, and 413*s*3*b* in comparison to the antenna 410*a*, which may include the first and second slot portions 413*s*1 and 413*s*2.

The impedance of the entire antenna may be changed according to the number of slot portions in the antenna. Typically, when the reflection coefficient is equal to or smaller than about −10 dB (negative 10 dB), the reflection is considered to scarcely occur. For the second graph GP2, the reflection coefficient is lower than that of the first graph GP1. Accordingly, the impedance is better matched in the antenna 410*b* than in the antenna 410*a*. According to an embodiment of the present disclosure, the number of the slot portions is adjusted to easily implement the impedance matching in the antenna.

Figure 8A:
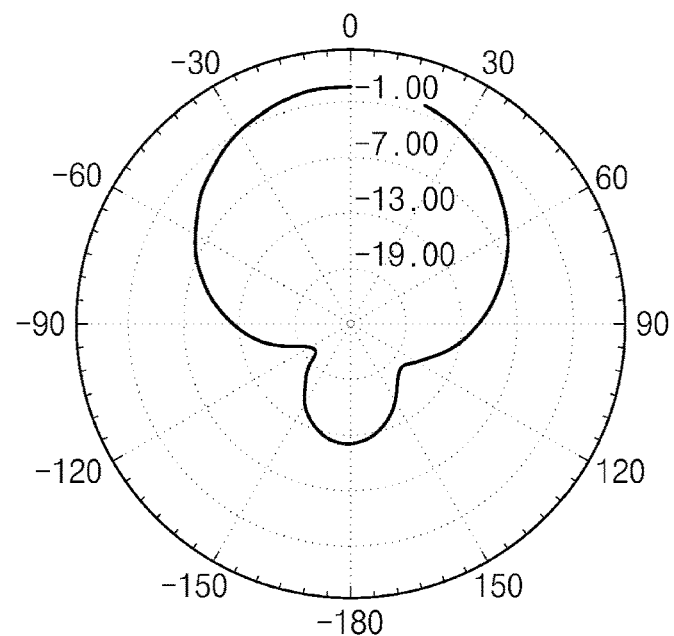
FIG. 8A illustrates a radiation pattern of the antenna illustrated in FIG. 5.
Figure 8B:
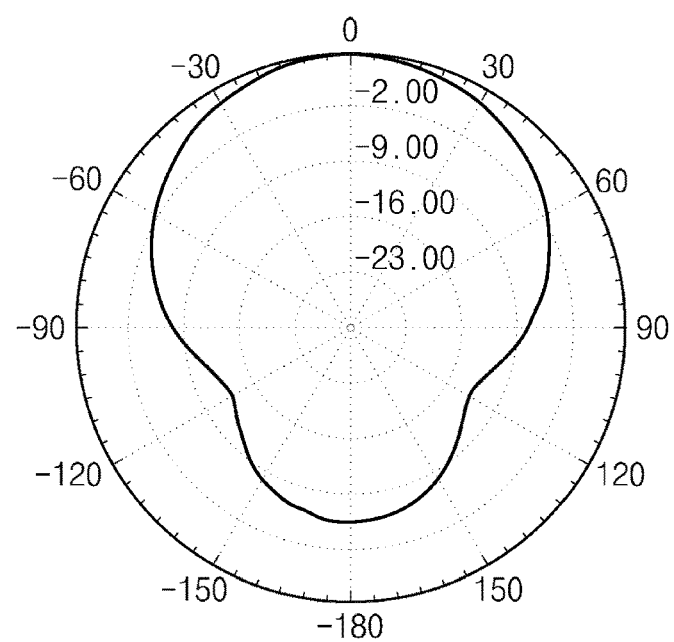
FIG. 8B illustrates a radiation pattern of the antenna illustrated in FIG. 6.

FIG. 8A illustrates a radiation pattern of the antenna illustrated in FIG. 5. FIG. 8B illustrates a radiation pattern of the antenna illustrated in FIG. 6. FIGS. 8A and 8B respectively illustrate irradiation patterns of the antennas 410*a* and 410*b* at the same frequency.

Referring to FIGS. 5, 6, 8A, and 8B, the irradiation gain (see FIG. 8B) of the antenna 410*b* at zero degrees is higher than that (see FIG. 8A) of the antenna 410*a* at zero degrees. For example, the irradiation gain may be controlled according to (e.g., may be determined by or may depend on) the shapes and number of the slot portions provided to each of the antennas 410*a* and 410*b*. According to an embodiment of the present disclosure, the number of the slot portions is adjusted (e.g., set) to easily control the irradiation gain of the antenna.

Figure 9:
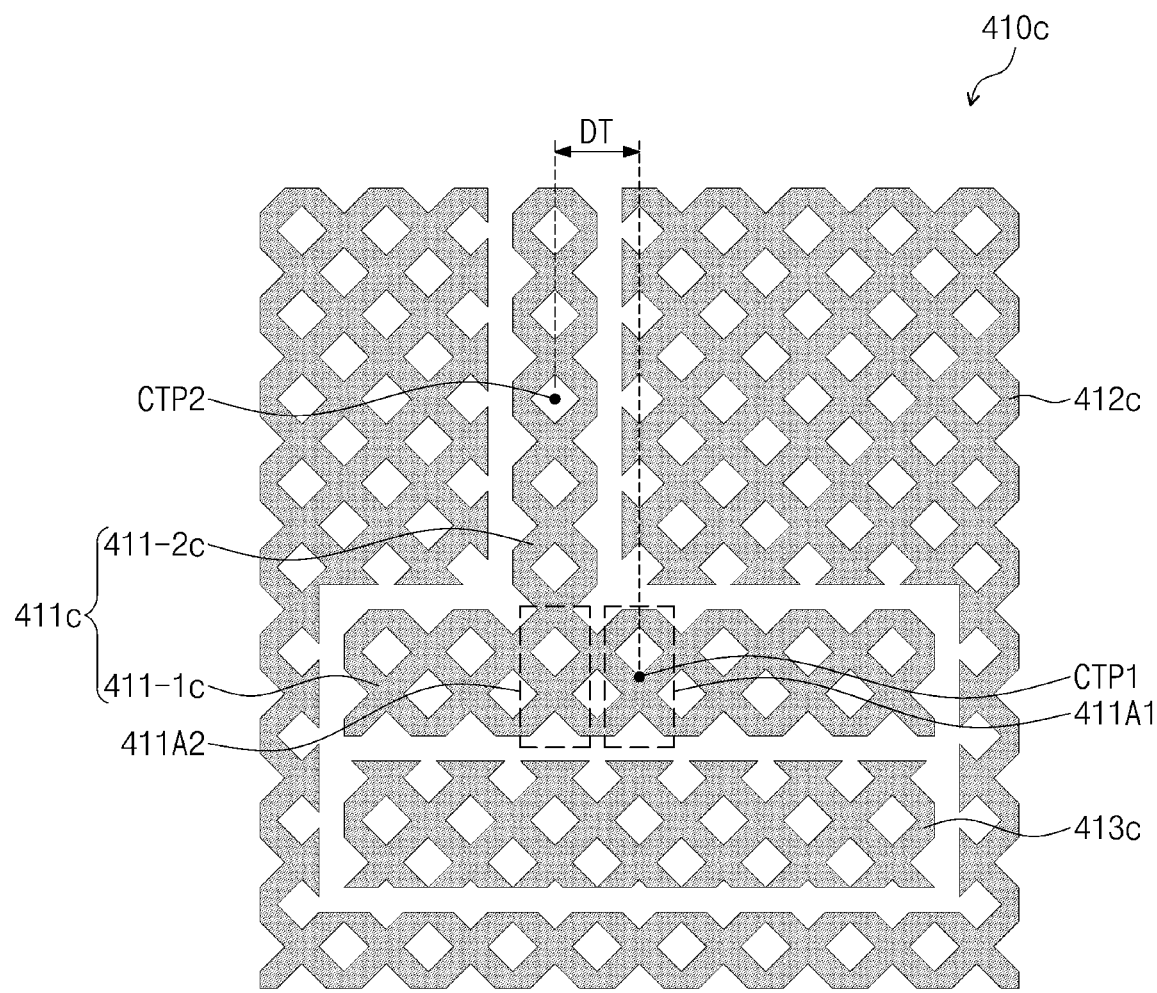
FIG. 9 is a plan view of an antenna according to an embodiment of the present disclosure.
Figure 10:
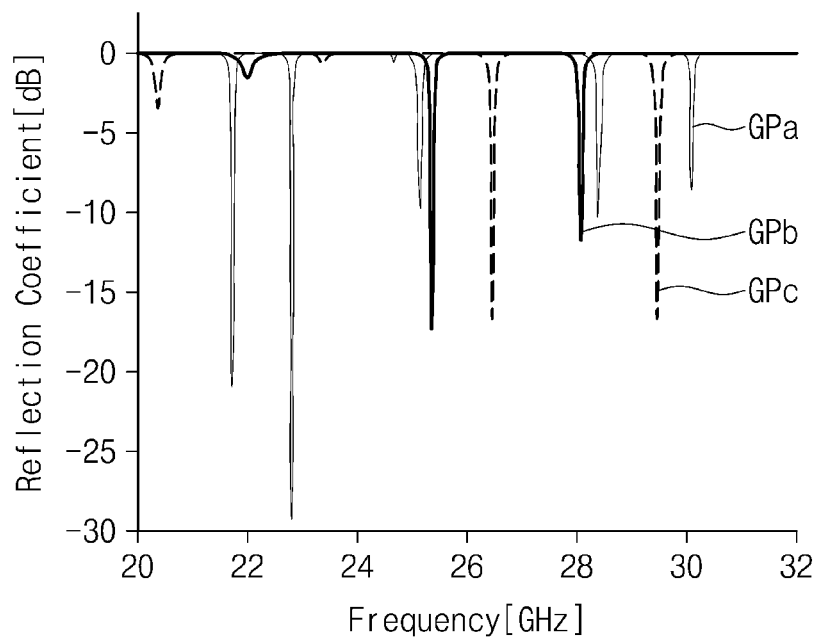
FIG. 10 shows graphs representing reflection coefficients according to a frequency.

FIG. 9 is a plan view of an antenna according to an embodiment of the present disclosure. FIG. 10 shows graphs representing reflection coefficients according to a frequency.

Referring to FIGS. 3A, 4, and 9, one antenna 410*c* is enlarged and illustrated in FIG. 9. The antenna 410*c* may include a first pattern 411*c*, a second pattern 412*c*, and a third pattern 413*c*. Each of the first pattern 411*c*, the second pattern 412*c*, and the third pattern 413*c* may have a mesh structure (e.g., a structure having a mesh shape).

The first pattern 411*c* may include a first pattern portion 411-1*c* and a second pattern portion 411-2*c*. The first pattern portion 411-1*c* extends along the first direction DR1, and the second pattern portion 411-2*c* may extend from the first pattern portion 411-1*c* along the second direction DR2.

A first area 411A1 and a second area 411A2 may be defined in the first pattern portion 411-1*c*. The second area 411A2 may be separated from (e.g., spaced apart from) the first area 411A1 in the first direction DR1. While the second pattern portion 411-2*b* illustrated in FIG. 6 extends from the first area 411A1 of the first pattern portion 411-1*b* (see FIG. 6), the second pattern portion 411-2*c* illustrated in FIG. 9 may extend from the second area 411A2 of the first pattern portion 411-1*c*.

When the position of the second pattern portion 411-2*c* is changed with respect to the first pattern portion 411-1*c* (e.g., with respect to where along the second direction DR2, the second pattern portion 411-2*c* branches off from the first pattern portion 411-1*c*), the reflection coefficient and the resonant frequency of the antenna 410*c* may be changed. Description about the foregoing will be provided with reference to FIG. 10. Accordingly, the position of the second pattern portion 411-2*c* with respect to the first pattern portion 411-1*c* may be controlled to easily adjust the resonant frequency.

The resonant frequency may be changed according to the distance DT (e.g., the distance along the first direction DR1) between the center CTP1 of the first pattern portion 411-1*c* and the center CTP2 of the second pattern portion 411-2*c*. The center CTP1 may be the center of the first pattern portion 411-1*c* in the first direction DR1, and the center CTP2 may be the center of the second pattern portion 411-2*c* in the first direction DR1.

Referring to FIG. 10, a first graph GPa is a graph showing the reflection coefficient according to a frequency when the distance DT is about 0.8 mm, a second graph GPb is a graph showing the reflection coefficient according to a frequency when the distance DT is about 1.3 mm, and a third graph GPc is a graph showing the reflection coefficient according to a frequency when the distance DT is about 1.49 mm. For example, it may be confirmed, through the graph of FIG. 10, that the resonant frequency is changed according to the position of the second pattern portion 411-2*c* with respect to the first pattern portion 411-1*c*.

According to an embodiment of the present disclosure, each of the antennas 410 illustrated in FIG. 4 may include (e.g., be) any one among the antennas 410*a*, 410*b*, and 410*c* illustrated in FIGS. 5, 6, and 9. For example, the antennas 410 illustrated in FIG. 4 may have different shapes (e.g., designs or structures), and the shape of each antenna 410 may be according to one of the antennas 410*a*, 410*b*, and 410*c* illustrated in FIGS. 5, 6, and 9. When the antennas 410 (see FIG. 4) include antennas of various suitable shapes, the display device 1000 (see FIG. 1) becomes communicable in various suitable frequency bands.

For example, the antennas 410 may have the shape of the antenna 410b illustrated in FIG. 6. In some embodiments, some antennas 410 (see FIG. 4) may have the shape of the antenna 410b illustrated in FIG. 6, and the others may have the shape of the antenna 410c illustrated in FIG. 9. In some embodiments, some antennas 410 may have the shape of the antenna 410a illustrated in FIG. 5, others may have the shape of the antenna 410b illustrated in FIG. 6, and the others may have the shape of the antenna 410c illustrated in FIG. 9.

Figure 11:
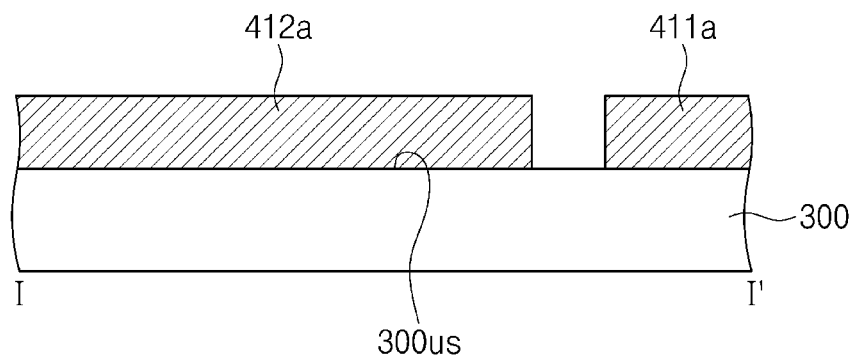
FIG. 11 is a cross-sectional view illustrating a cross section cut along line I-I' of FIG. 5.
Figure 11:
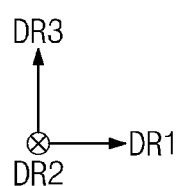

FIG. 11 is a cross-sectional view illustrating a cross section cut along line I-I' of FIG. 5.

Referring to FIG. 11, the first pattern 411a and the second pattern 412a may be disposed on the same layer. For example, the first pattern 411a and the second pattern 412a may be disposed on the top surface 300us of the sensing layer 300.

Figure 12A:
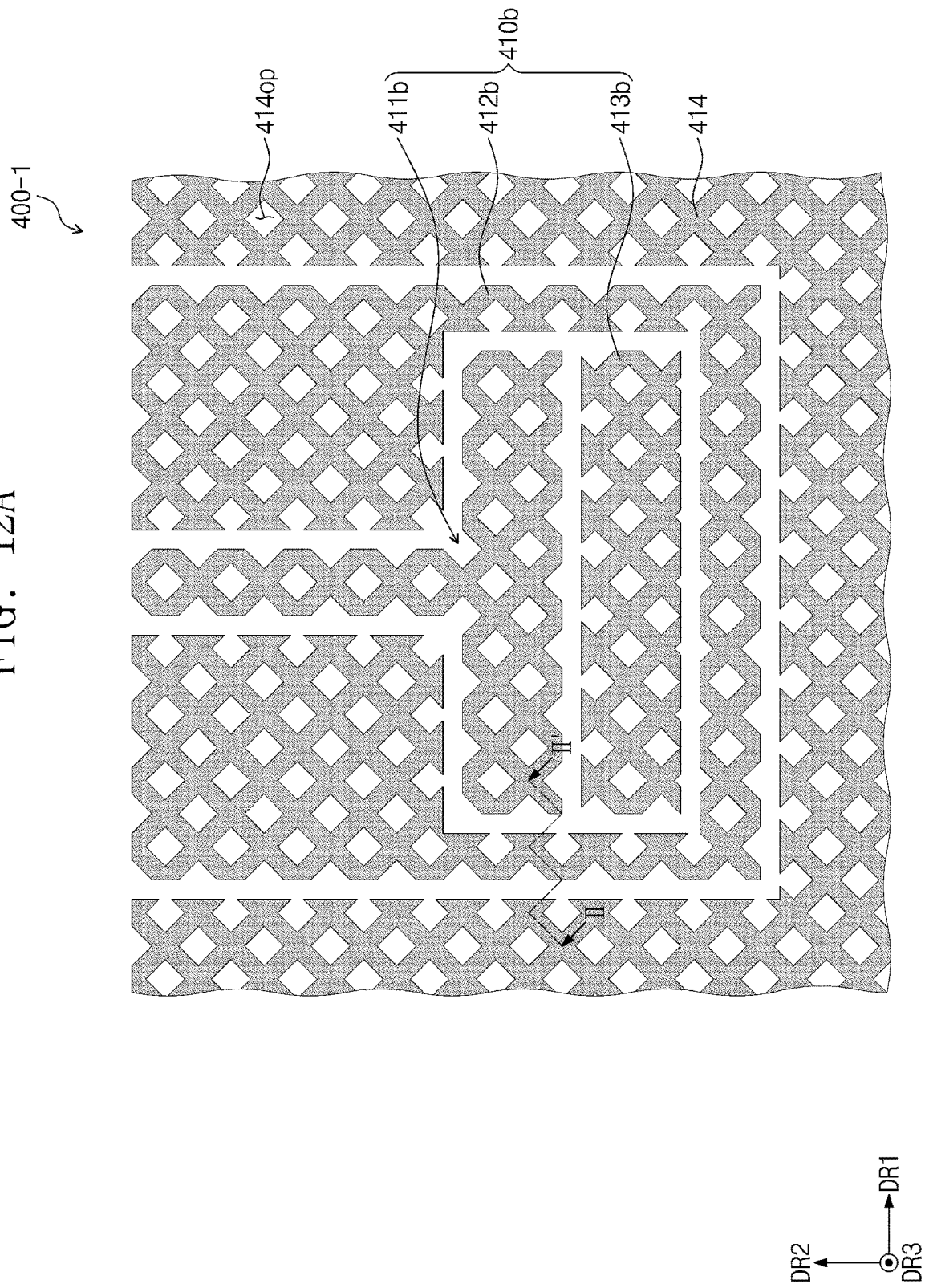
FIG. 12A is a plan view illustrating a portion of an antenna layer.
Figure 12B:
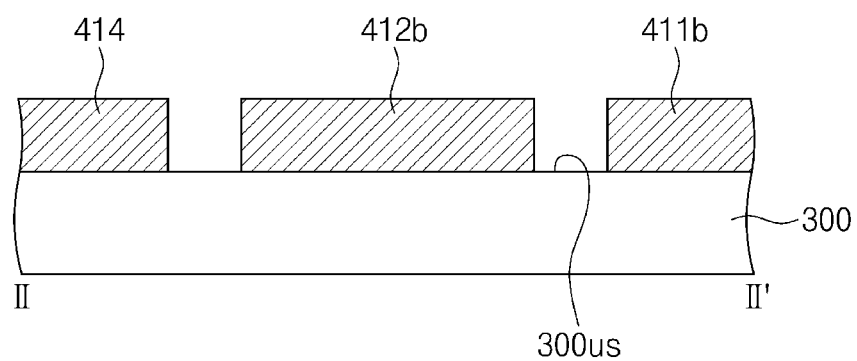
FIG. 12B is a cross-sectional view illustrating a cross section cut along line II-II' of FIG. 12A.

FIG. 12A is a plan view illustrating a portion of an antenna layer. FIG. 12B is a cross-sectional view illustrating a cross section cut along line II-II' of FIG. 12A.

Referring to FIGS. 12A and 12B, the antenna layer 400-1 may further include a dummy pattern 414. The dummy pattern 414 may be disposed in the display area 1000A (see FIG. 4) in which the antenna 410b is not disposed. Accordingly, the difference in reflection ratio between the area in which the antenna 410b is disposed and the area in which the antenna 410b is not disposed may be reduced. Accordingly, the antenna 410b may be prevented from being viewed from the outside, or the visibility of the antenna 410b from the outside may be reduced.

The dummy pattern 414 may have a mesh structure (e.g., a structure having a mesh shape). Accordingly, an opening 414op provided in the dummy pattern 414 may overlap the light emitting area PXA (see FIG. 3A), and the dummy pattern 414 may be disposed in the surrounding area NPXA (see FIG. 3A). For example, the dummy pattern 414 may be separated from (e.g., may not overlap or may be spaced apart from) the light emitting area PXA.

The antenna 410b and the dummy pattern 414 may be disposed on the same layer. For example, the first pattern 411b, the second pattern 412b, and the third pattern 413b of the antenna 410b, and the dummy pattern 414 may be disposed on the top surface 300us of the sensing layer 300.

Figure 13:
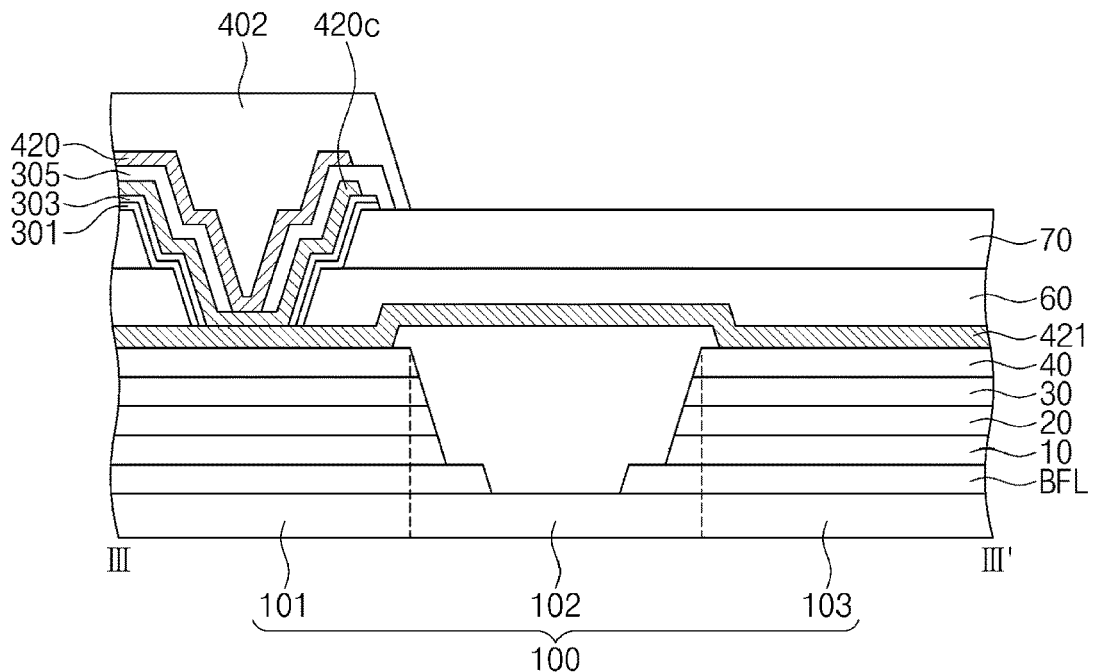
FIG. 13 is a cross-sectional view illustrating a cross section cut along line III-III' of FIG. 4.
Figure 14:
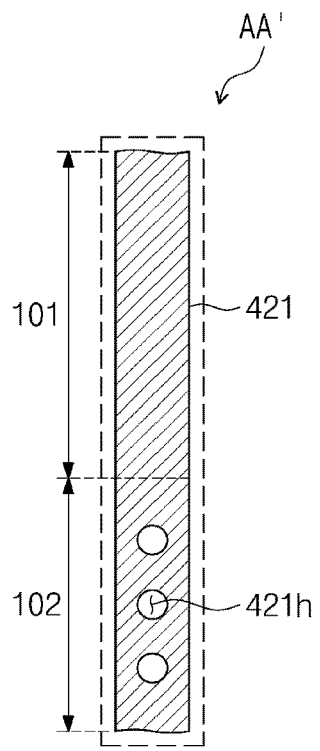
FIG. 14 is an enlarged plan view of area AA' illustrated in FIG. 4.

FIG. 13 is a cross-sectional view illustrating a cross section cut along III-III' of FIG. 4. FIG. 14 is an enlarged plan view of area AA' illustrated in FIG. 4.

Referring to FIG. 13, an antenna wiring 420 may be electrically coupled (e.g., electrically connected) to an extension wiring 421 disposed under the antenna wiring 420 in the first base area 101. For example, the antenna wiring 420 may contact (e.g., directly or physically contact) a connection wiring 420c disposed under the antenna wiring 420, and the connection wiring 420c may contact (e.g., directly or physically contact) the extension wiring 421. Accordingly, the antenna wiring 420 may be electrically coupled (e.g., electrically connected) to the extension wiring 421 through the connection wiring 420c.

The extension wiring 421 may be a wiring disposed on the same layer as the second connection electrode CNE2 (see FIG. 3A), and/or the connection wiring 420c may be a component included in the second sensing conductive layer 304 (see FIG. 3A).

The extension wiring 421 may extend from the first base area 101 towards the third base area 103 via the second base area 102. For example, the extension wiring 421 may extend from the first base area 101, through the second base area 102, and to the third base area 103. The second base area 102 may be a bending area to be bent. Accordingly, a portion of the extension wiring 421 disposed in the second base area 102 may be provided with a hole 421h. As the hole 421h is provided, the stress applied to the extension wiring 421 becomes reduced, and a probability that a crack occurs in the extension wiring 421 may be reduced. For example, the hole 421h in the extension wiring 421 may reduce the stress applied to the extension wiring 421 when the second base area 102 is bent compared to when the extension wiring 421 does not have the hole 421h. In addition, the pixel definition layer 70, which overlaps the second base area 102, may be further provided thereon with a protection layer for protecting the bending area.

Figure 15:
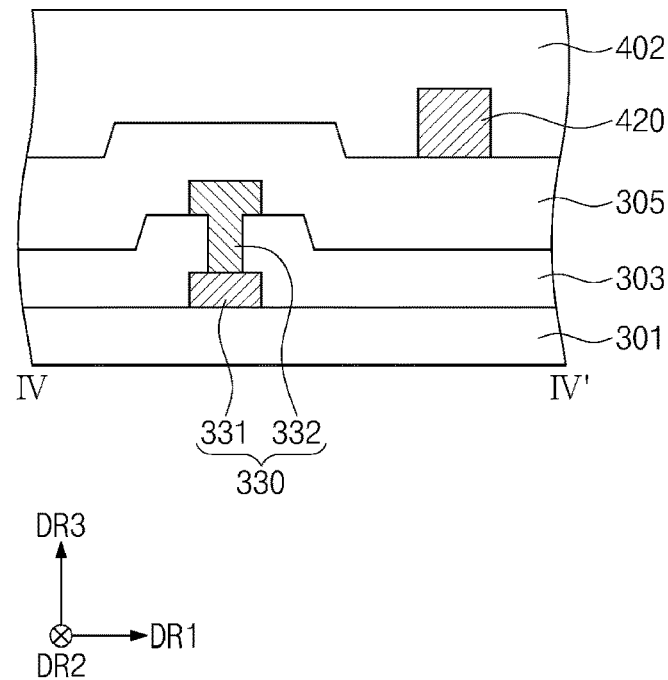
FIG. 15 is a cross-sectional view illustrating a cross section cut along line IV-IV' of FIG. 4.

FIG. 15 is a cross-sectional view illustrating a cross section cut along line IV-IV' of FIG. 4.

Referring to FIGS. 3A, 4, and 15, one sensing wiring 330 and one antenna wiring 420 are illustrated. The sensing wiring 330 may be configured with a plurality of conductive layers, and the antenna wiring 420 may be configured with a single conductive layer. The sensing wiring 330 and the antenna wiring 420 may be disposed on different layers. For example, the single conductive layer of the antenna wiring 420 may be on (e.g., above) the plurality of conductive layers of the sensing wiring 330. Accordingly, even when the sensing wiring 330 and the antenna wiring 420 cross each other, the sensing wiring 330 and the antenna wiring 420 may be insulated from each other.

The sensing wiring 330 may include a first sensing wiring pattern 331 and a second sensing wiring pattern 332. The first sensing wiring pattern 331 may be a component included in the first sensing conductive layer 302, and the second sensing wiring pattern 332 may be a component included in the second sensing conductive layer 304. The antenna wiring 420 may be included in the antenna conductive layer 401.

Figure 16:
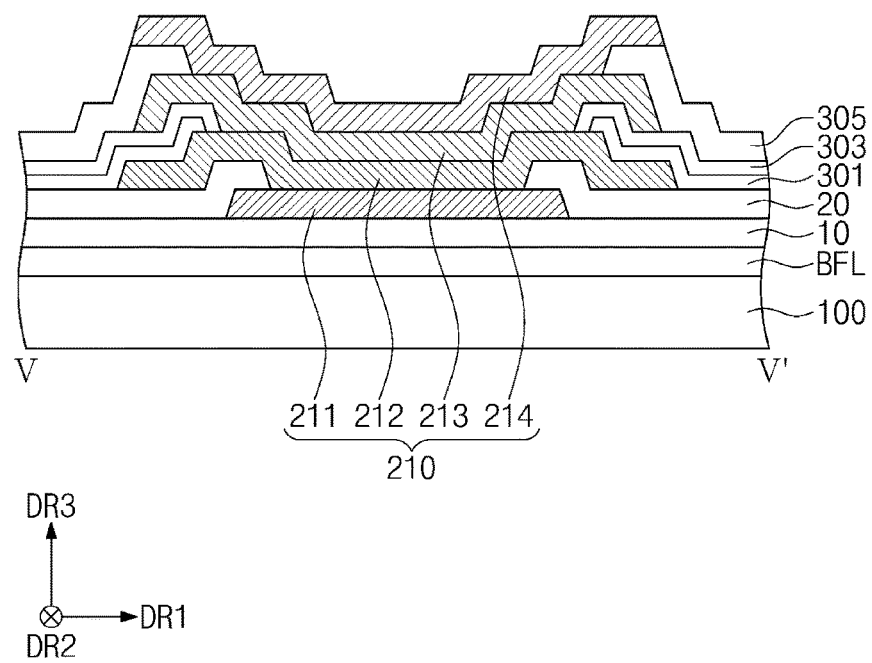
FIG. 16 is a cross-sectional view illustrating a cross section cut along line V-V' in FIG. 4.
Figure 17:
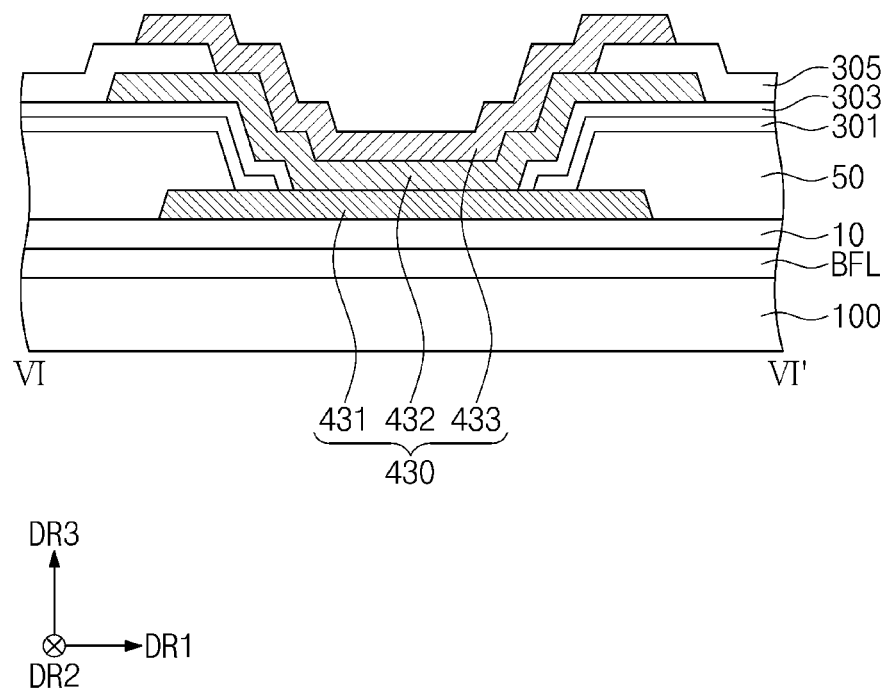
FIG. 17 is a cross-sectional view illustrating a cross section cut along line VI-VI' of FIG. 4.

FIG. 16 is a cross-sectional view illustrating a cross section cut along line V-V' in FIG. 4. FIG. 17 is a cross-sectional view illustrating a cross section cut along line VI-VI' of FIG. 4.

FIG. 16 is a cross-sectional view in which one driving chip pad 210 is cut, and FIG. 17 is a cross-sectional view in which one antenna pad 430 is cut.

The one driving chip pad 210 may include at least four conductive patterns, namely, first, second, third, and fourth conductive patterns 211, 212, 213, and 214. The one antenna pad 430 may include at least three conductive patterns, namely, first, second, and third conductive patterns 431, 432, and 433.

The first conductive pattern 211 may be disposed on the same layer as the gate G1 (see FIG. 3A) and may be a pattern including (e.g., being) the same material as the gate G1. The second conductive pattern 212 and the first conductive pattern 431 may be disposed on the same layer as the first connection electrode CNE1 (see FIG. 3A) or the second connection electrode CNE2 (see FIG. 3A) and may include (e.g., be) the same material as the first connection electrode CNE1 or the second connection electrode CNE2. The third conductive pattern 213 and the second conductive pattern 432 may be components included in the second sensing conductive layer 304 (see FIG. 3A). The fourth conductive pattern 214 and the third conductive pattern 433 may be included in the antenna conductive layer 401 (see FIG. 3A).

Figure 18:
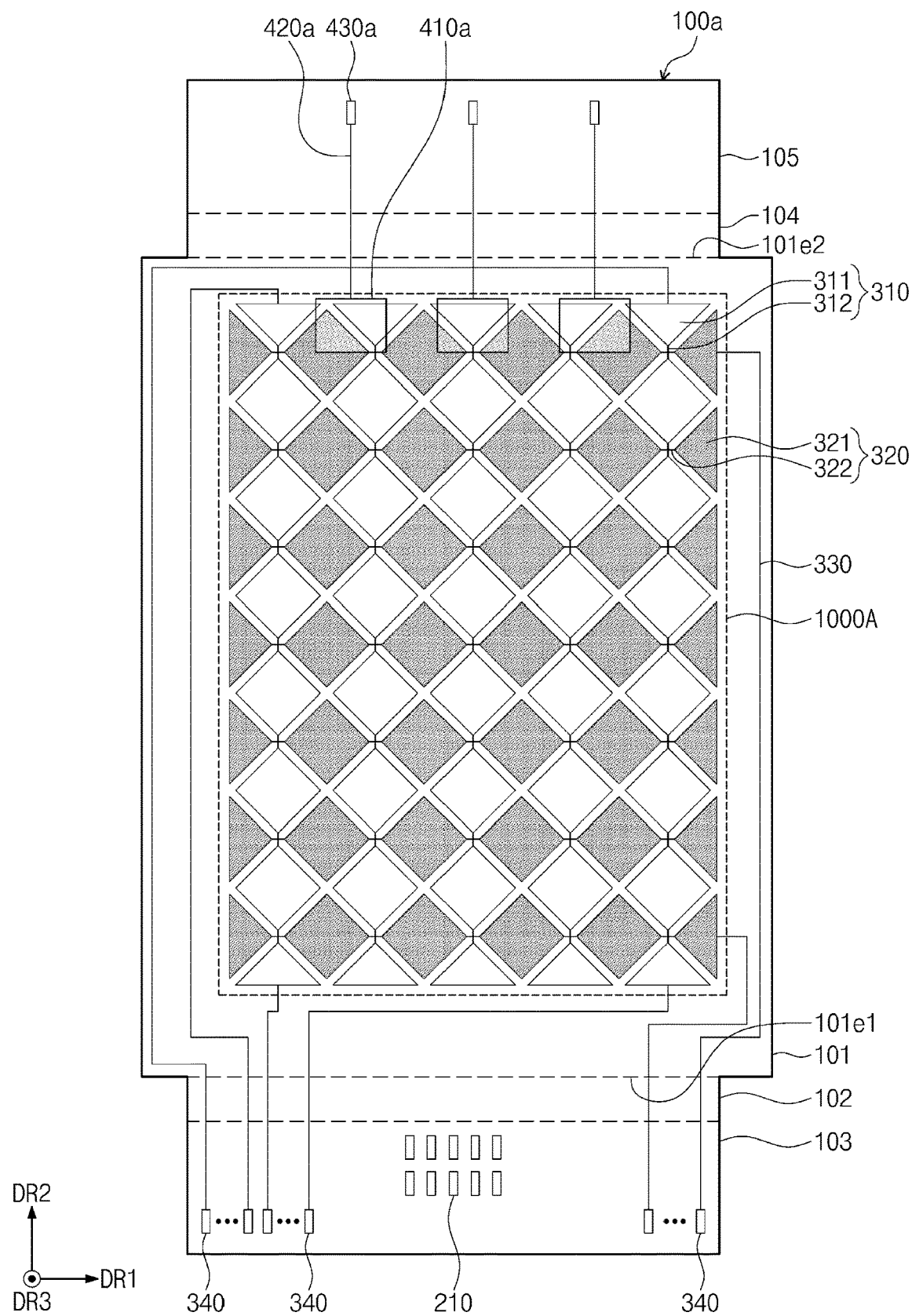
FIG. 18 is a plan view illustrating some components of a display device according to an embodiment of the present disclosure.

FIG. 18 is a plan view illustrating some components of a display device according to an embodiment of the present disclosure.

Referring to FIG. 18, the base layer 100a may be defined with the first base area 101, the second base area 102, the third base area 103, a fourth base area 104, and a fifth base area 105. The first base area 101 may be an area overlapping the light emitting area PXA and the surrounding area NPXA.

The second base area 102 may extend from a first edge portion 101*e*1 of the first base area 101. The third base area 103 may extend from the second base area 102. The fourth base area 104 may extend from a second edge portion 101*e*2 of the first base area 101. The fifth base area 105 may extend from the fourth base area 104. For example, the fourth base area 104 may be between the first base area 101 and the fifth base area 105 (in the second direction DR2).

The second base area 102 and the fourth base area 104 may be respectively referred to as bending areas, which may be bent towards the rear surface of the first base area 101 in an assembly process of the display device 1000 (see FIG. 1).

FIG. 18 illustrates that the first edge portion 101*e*1 and the second edge portion 101*e*2 extend along the first direction DR1, and are separated in the second direction DR2 as an example, but the present disclosure is not limited thereto. For example, the first edge portion 101*e*1 may be an edge of the first base area 101 extending along the first direction DR1, and the second edge portion 101*e*2 may be an edge of the first base area 101 extending along the second direction DR2.

The plurality of antennas 410*a*, the plurality of antenna wirings 420*a*, and the plurality of antenna pads 430*a* may be disposed on the base layer 100*a*.

The antenna wirings 420*a* may be respectively electrically coupled (e.g., electrically connected) to the antennas 410*a*. The antenna pads 430*a* may be respectively electrically coupled (e.g., electrically connected) to the antenna wirings 420*a*. The antenna pads 430*a* may be disposed on the fifth base area 105. Accordingly, the antenna pads 430*a* and the sensing pads 340 may be disposed on different base areas. For example, as an area in which the antenna pads 430*a* are to be disposed is provided separately from an area in which the sensing pads 340 are to be disposed, the processing latitude may be further enhanced.

Figure 19:
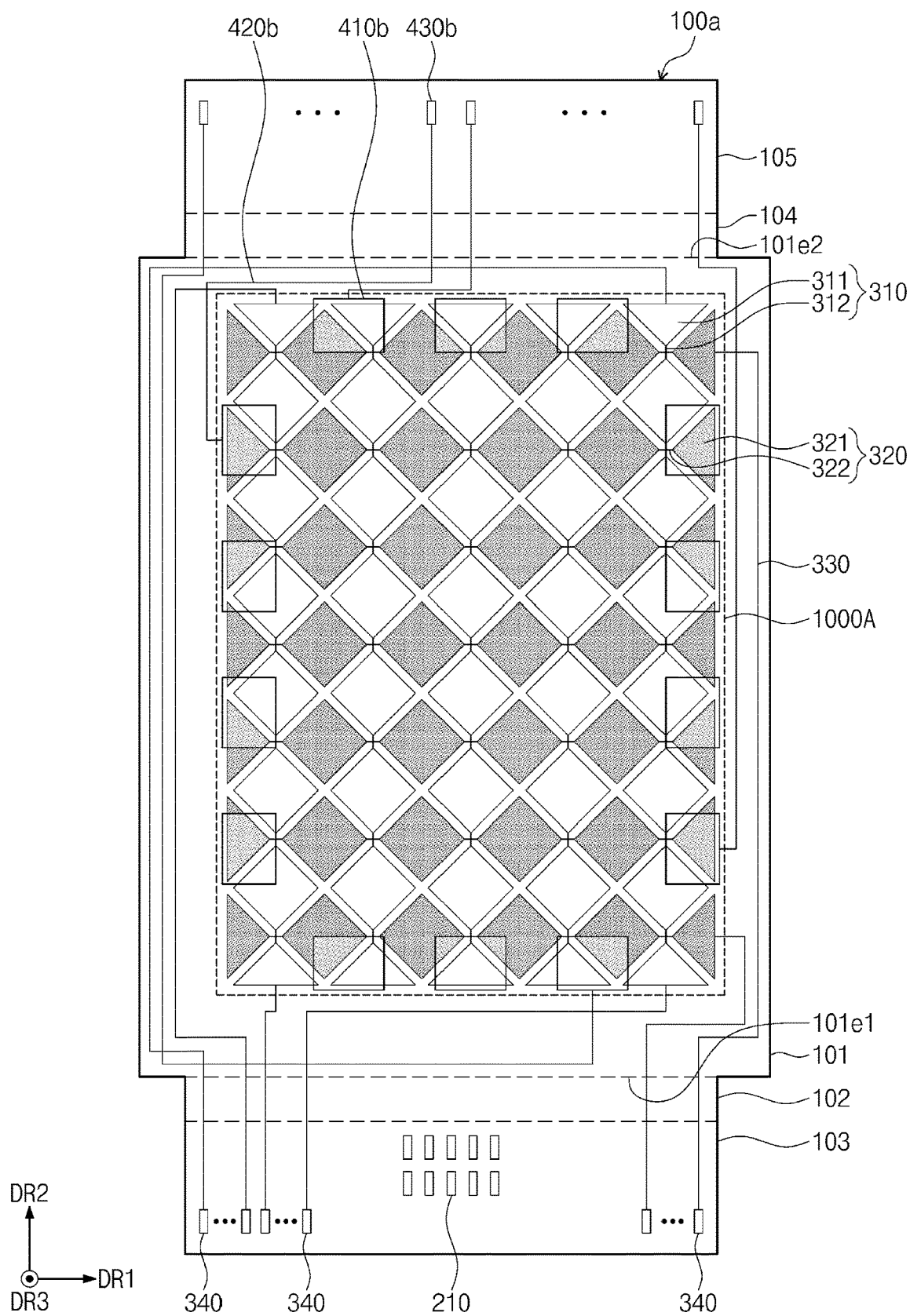
FIG. 19 is a plan view illustrating some components of a display device according to an embodiment of the present disclosure.

FIG. 19 is a plan view illustrating some components of a display device according to an embodiment of the present disclosure.

Referring to FIG. 19, the plurality of antennas 410*b*, the plurality of antenna wirings 420*b*, and the plurality of antenna pads 430*b* may be disposed on the base layer 100*a*. The number of the plurality of antennas 410*b* may be greater than the number of the plurality of antennas 410*a* illustrated in FIG. 18.

The antennas 410*b* may be disposed in the display area 1000A, and provided adjacently to the four sides of the display area 1000A. However, the foregoing is an example, and the antennas 410*b* may be provided adjacently to only two sides, or only three sides of the display area 1000A.

Figure 20:
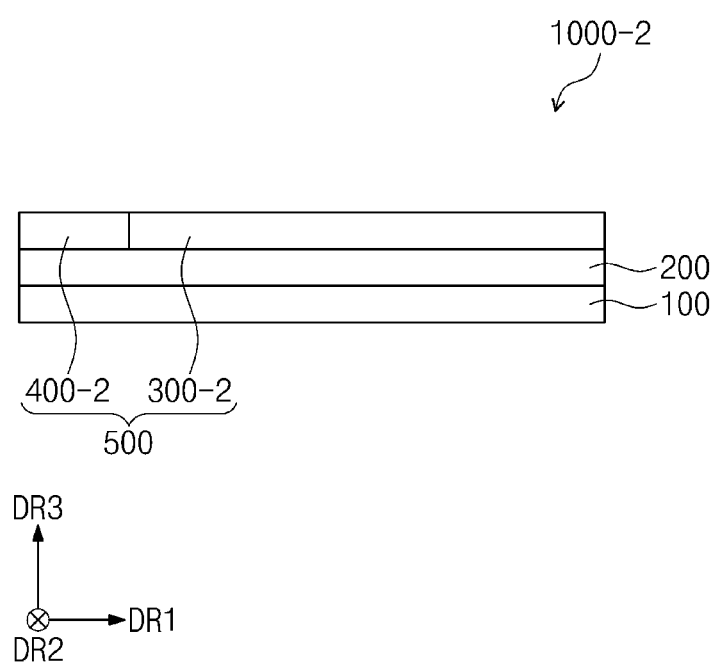
FIG. 20 is a schematic cross-sectional view of a display device according to an embodiment of the present disclosure.

FIG. 20 is a schematic cross-sectional view of a display device according to an embodiment of the present disclosure.

Referring to FIG. 20, the display device 1000-2 may include the base layer 100, the display layer 200, and an input layer 500. The input layer 500 may be directly disposed on the display layer 200. For example, the input layer 500 may be disposed on the display layer 200 through a consecutive process. Because a separate adhesive member is not arranged between the input layer 500 and the display layer 200, the transmissivity of the display device 1000-2 may be improved, and the display device 1000-2 of a thin-type (e.g., a relatively thin display device) may be implemented.

The input layer 500 may be a layer in which an external input applied from the outside is sensed, and a radio frequency signal is transmitted, received, or transmitted and received. The input layer 500 may include both a sensing layer 300-2 and an antenna layer 400-2.

Figure 21:
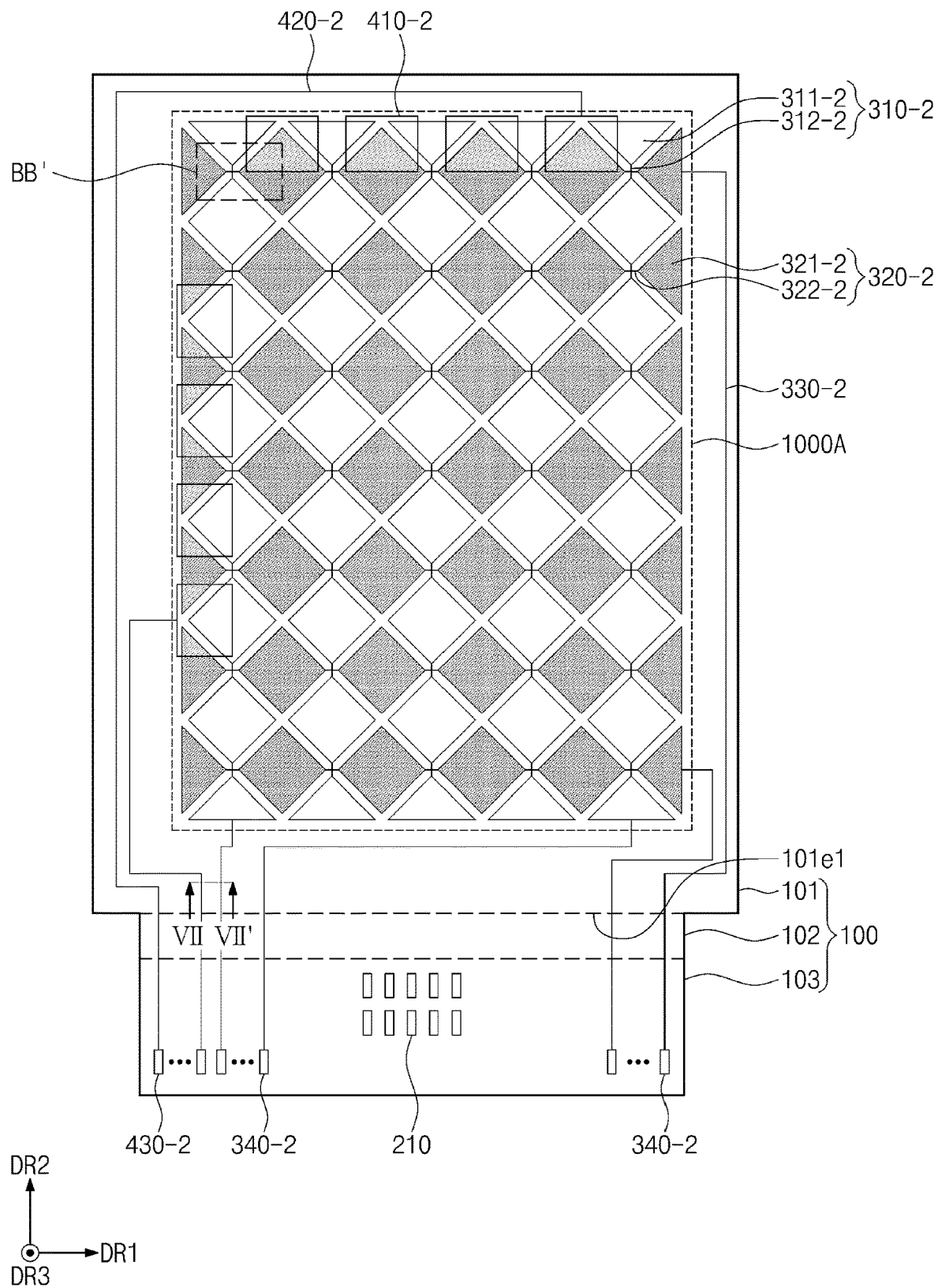
FIG. 21 is a plan view illustrating some components of a display device according to an embodiment of the present disclosure.
Figure 22:
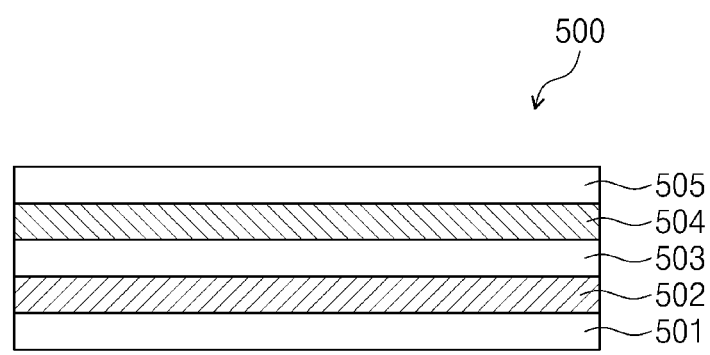
FIG. 22 is a schematic cross-sectional view of an input layer illustrated in FIG. 20.
Figure 22:
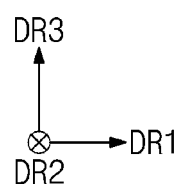

FIG. 21 is a plan view illustrating some components of a display device according to an embodiment of the present disclosure. FIG. 22 is a schematic cross-sectional view of an input layer illustrated in FIG. 20.

Referring to FIGS. 20, 21, and 22, the input layer 500 may include a first insulation layer 501, a first conductive layer 502, a second insulation layer 503, a second conductive layer 504, and a third insulation layer 505. The first insulation layer 501 may correspond to the base insulation layer 301 explained with respect to FIG. 3A, the first conductive layer 502 may correspond to the first sensing conductive layer 302 explained with respect to FIG. 3A, the second conductive layer 504 may correspond to the second sensing conductive layer 304 explained with respect to FIG. 3A, and the third insulation layer 505 may correspond to the cover insulation layer 305 explained with respect to FIG. 3A. In some embodiments, the second insulation layer 503 may correspond to the sensing insulation layer 303 explained with respect to FIG. 3A The input layer 500 may include both the sensing layer 300-2 and the antenna layer 400-2. The sensing layer 300-2 may include a plurality of first sensing electrodes 310-2 (hereinafter, first sensing electrodes), a plurality of second sensing electrodes 320-2 (hereinafter, second sensing electrodes), and a plurality of sensing pads 340-2 (hereinafter, sensing pads).

Each of the first sensing electrodes 310-2 may include a plurality of sensing patterns 311-2 and a bridge pattern 312-2 electrically coupled (e.g., electrically connected) to two adjacent sensing patterns 311-2 among the plurality of sensing patterns 311-2.

The plurality of sensing patterns 311-2 and the bridge pattern 312-2 may be disposed on different layers. For example, when the bridge pattern 312-2 is included in the second conductive layer 504, the plurality of sensing patterns 311-2 may be included in the first conductive layer 502.

Each of the second sensing electrodes 320-2 may include a plurality of first portions 321-2 and a second portion 322-2 defined between adjacent first portions 321-2 among the plurality of first portions 321-2. The first portions 321-2 may be referred to as sensing portions, and the second portion 322-2 may be referred to as a connection portion or a crossing portion.

The first portions 321-2 and the second portion 322-2 may be coupled (e.g., connected) to each other to have an integrated shape. Accordingly, the second portion 322-2 may be defined as a portion crossing the bridge pattern 312-2 in each of the second sensing electrodes 320-2. The first portions 321-2 and the second portion 322-2 may be disposed on the same layer as the sensing patterns 311-2.

Figure 23:
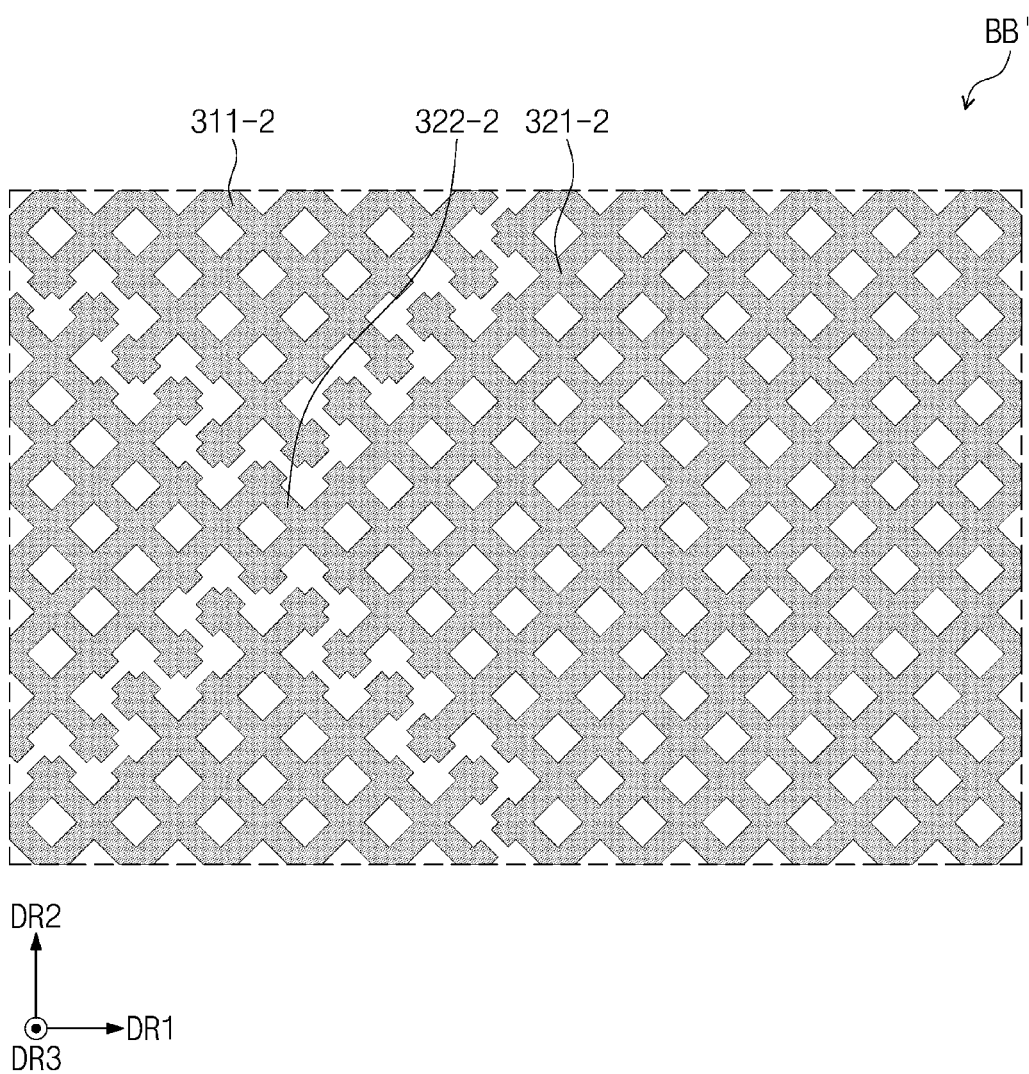
FIG. 23 is a plan view of a first conductive layer corresponding to area BB' of FIG. 21.

FIG. 23 is a plan view of the first conductive layer 502 (see FIG. 22) corresponding to area BB' of FIG. 21. Referring to FIG. 23, the first portions 321-2 and the second portion 322-2 may be disposed on the same layer as the plurality of sensing patterns 311-2.

Referring to FIGS. 21 and 22 again, the antenna layer 400-2 may include a plurality of antennas 410-2 (hereinafter, antennas), a plurality of antenna wirings 420-2 (hereinafter, antenna wirings), and a plurality of antenna pads 430-2 (hereinafter, antenna pads).

Figure 24:
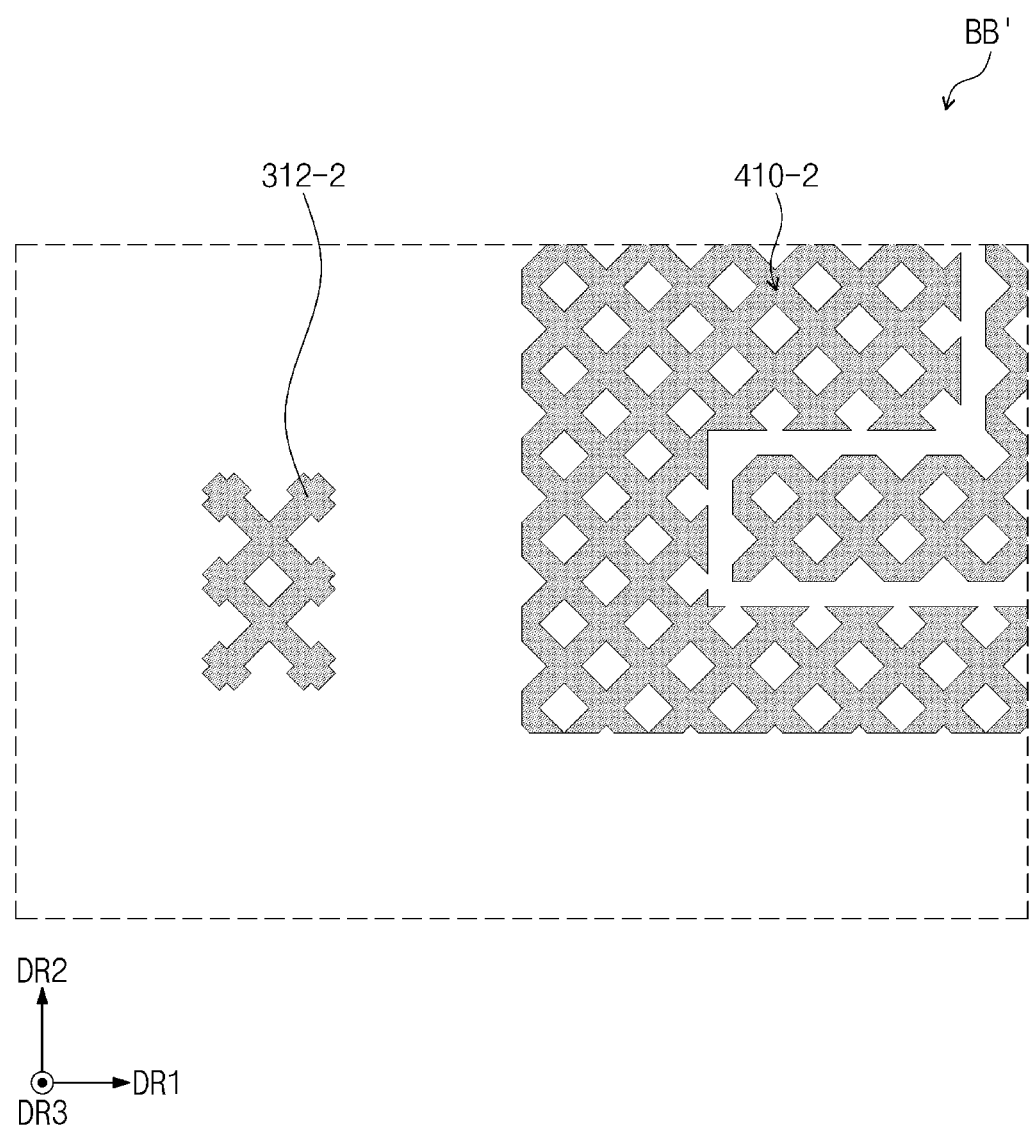
FIG. 24 is a plan view of a second conductive layer corresponding to area BB' of FIG. 21.

FIG. 24 is a plan view of the second conductive layer 504 (see FIG. 22) corresponding to area BB' of FIG. 21. Referring to FIG. 24, the antennas 410-2 may be included in the second conductive layer 504 (see FIG. 22). The antennas 410-2 may be disposed on the same layer as the bridge pattern 312-2.

Because the antennas 410-2 are disposed on the same layer as the bridge pattern 312-2, the antennas 410-2 may be separated from the bridge pattern 312-2. Accordingly, when viewed from the third direction DR3, the antennas 410-2 may not overlap the bridge pattern 312-2.

Referring to FIGS. 21 and 22 again, the antennas 410-2 correspond to components for emitting a signal to the outside and for receiving a signal from the outside. Accordingly, the antennas 410-2 may be disposed on (e.g., included in) the second conductive layer 504 among the first conductive layer 502 and the second conductive layer 504. The second conductive layer 504 may be a layer disposed further away from the display layer 200 than the first conductive layer 502 is to the display layer 200. For example, the first conductive layer 502 may be closer to the display layer 200 than the second conductive layer 504 is to the display layer 200. For example, in some embodiments, the first conductive layer 502 may be between the display layer 200 and the second conductive layer 504. In addition, the second conductive layer 504 may be a layer adjacent to the outermost surface (e.g., uppermost surface) of the display device 1000 (see FIG. 1) rather than to the first conductive layer 502.

The antennas 410-2 may be provided thereunder with the plurality of sensing patterns 311-2 or the first portions 321-2. Accordingly, an external input may be sensed even in an area overlapping the antennas 410-2.

Figure 25:
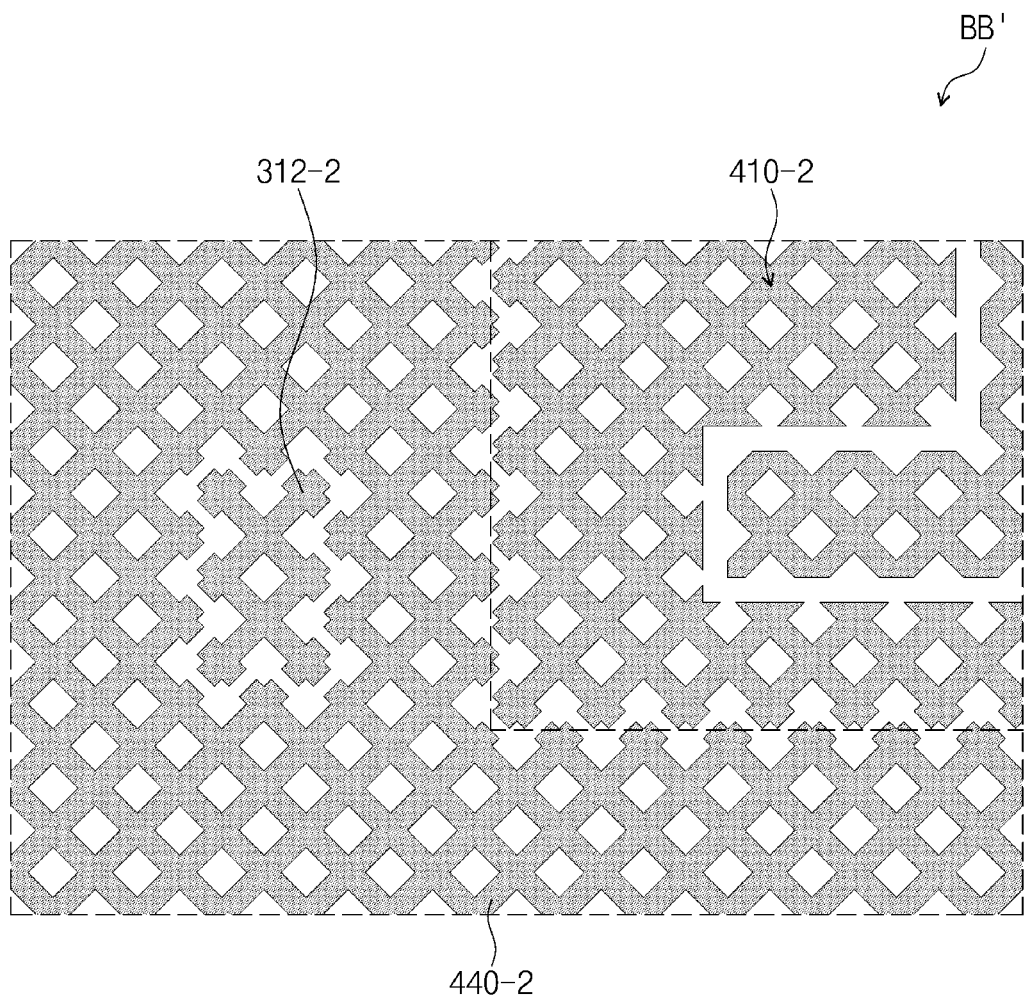
FIG. 25 is a plan view of the second conductive layer corresponding to area BB' of FIG. 21.

FIG. 25 is a plan view of the second conductive layer 504 corresponding to area BB' of FIG. 21.

Referring to FIG. 25, the second conductive layer 504 may include the antennas 410-2, the bridge pattern 312-2, and a dummy pattern 440-2. The dummy pattern 440-2 may have a mesh structure (e.g., a structure having a mesh shape).

The dummy pattern 440-2 may be disposed in the display area 1000A (see FIG. 4) in which the antennas 410-2 and the bridge pattern 312-2 are not disposed. Accordingly, the difference in reflection ratio may be reduced between the area in which the antennas 410-2 and the bridge pattern 312-2 are disposed and the area in which the antennas 410-2 and the bridge pattern 312-2 are not disposed. Accordingly, the antennas 410-2 and the bridge pattern 312-2 may be prevented from being viewed from the outside, or the visibility of the antennas 410-2 and the bridge pattern 312-2 from the outside may be reduced.

The antennas 410-2, the bridge pattern 312-2, and the dummy pattern 440-2 may be separated from each other. Accordingly, when viewed from the third direction DR3, the antennas 410-2, the bridge pattern 312-2, and the dummy pattern 440-2 may not overlap each other.

Figure 26:
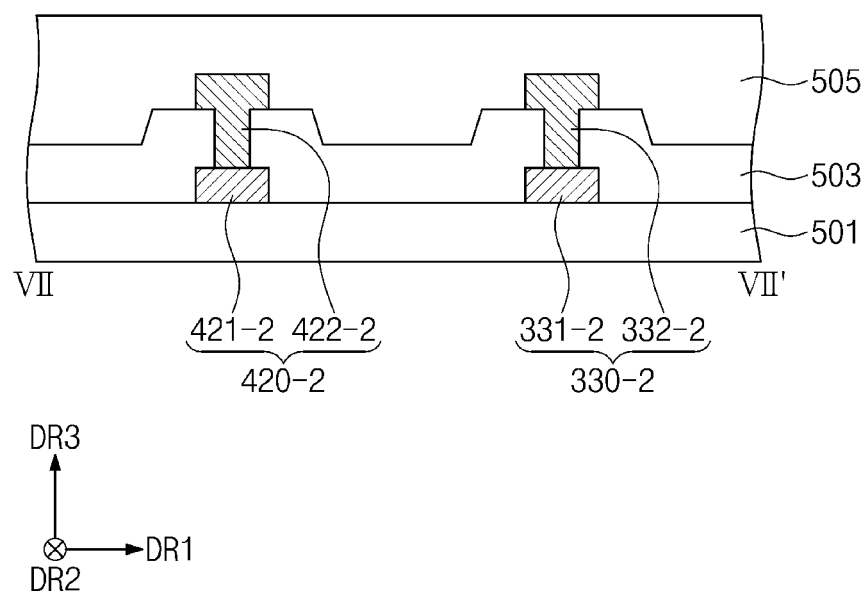
FIG. 26 is a cross-sectional view illustrating a cross section cut along line VII-VII' of FIG. 21.

FIG. 26 is a cross-sectional view illustrating a cross section cut along line VII-VII' of FIG. 21.

Referring to FIGS. 21 and 26, one sensing wiring 330-2 and one antenna wiring 420-2 are illustrated. Each of the sensing wiring 330-2 and the antenna wiring 420-2 may be configured with a plurality of conductive layers.

The sensing wiring 330-2 may include a first sensing wiring pattern 331-2 and a second sensing wiring pattern 332-2. The antenna wiring 420-2 may include a first antenna wiring pattern 421-2 and a second antenna wiring pattern 422-2. The first sensing wiring pattern 331-2 and the first antenna wiring pattern 421-2 may be components included in the first conductive layer 502 (see FIG. 22), and the second sensing wiring pattern 332-2 and the second antenna wiring pattern 422-2 may be components included in the second conductive layer 504 (see FIG. 22)

The sensing wiring 330-2 and the antenna wiring 420-2 may include wiring patterns disposed on the same layer. Accordingly, the sensing wiring 330-2 and the antenna wiring 420-2 may not cross each other, and may be separated and insulated from each other.

According to the present disclosure, the sensing layer may be directly disposed on the display layer, and the antenna layer may be directly disposed on the display layer or directly disposed on the sensing layer. Accordingly, an adhesion layer may not be disposed between the display layer, the sensing layer, and the antenna layer. As a result, the transmissivity of the display device may be improved, and the thin-type display device (e.g., the thin kind of display device) including the antenna may be provided.

In addition, the antenna layer may be provided in the display area of the display device. Even when the display device is miniaturized or thinned, or the area of the non-display area surrounding the display area is reduced, a space in which the antenna layer is to be disposed may be easily secured.

In addition, the shapes of the antennas included in the antenna layer may be different from each other. In this case, one display device is communicable in various suitable frequency bands.

While this disclosure has been described with reference to example embodiments thereof, it will be clear to those of ordinary skill in the art to which the disclosure pertains that various suitable changes and modifications may be made to the described embodiments without departing from the spirit and technical area of the disclosure as defined in the appended claims and their equivalents. Thus, the scope of the present disclosure shall not be restricted or limited by the foregoing description, but shall be determined by the broadest permissible interpretation of the following claims and equivalents thereof.

What is claimed is:
1. A display device comprising:
a base layer;
a display layer on the base layer and defined with a plurality of light emitting areas and a surrounding area around the plurality of light emitting areas in a plan view;
a sensing layer on the display layer and comprising a plurality of first sensing electrodes and a plurality of second sensing electrodes; and
an antenna layer on the display layer and comprising a plurality of antennas,
wherein each of the plurality of antennas comprises a first pattern configured to receive a signal, and a second pattern on a same layer as the first pattern, the second pattern being separated from the first pattern and grounded,
wherein the first pattern comprises a first pattern portion extending along a first direction and a second pattern portion extending from the first pattern portion along a second direction crossing the first direction,
wherein at least one of the plurality of antennas further comprises a third pattern extending along the first direction, and
wherein the third pattern is arranged between the first pattern portion and the second pattern.

2. The display device of claim 1, wherein each of the first pattern, the second pattern, and the third pattern has a mesh structure and overlaps the surrounding area in the plan view.

3. The display device of claim 1, wherein a slot is defined between the first pattern and the second pattern.

4. The display device of claim 1, wherein the first pattern portion is defined with a first area and a second area separated from the first area in the first direction,
wherein the plurality of antennas comprise a first antenna and a second antenna, and
wherein the second pattern portion of the first antenna extends from the first area of the first antenna, and the second pattern portion of the second antenna extends from the second area of the second antenna.

5. The display device of claim 1, wherein the sensing layer further comprises a cover insulation layer configured to cover the plurality of first sensing electrodes and the plurality of second sensing electrodes, and
wherein the plurality of antennas are on the cover insulation layer.

6. The display device of claim 5, wherein the sensing layer further comprises a planarization insulation layer on the cover insulation layer, and
wherein the plurality of antennas are directly on the planarization insulation layer.

7. The display device of claim 5, wherein the antenna layer further comprises a dummy pattern separated from the plurality of antennas and on the cover insulation layer, and
wherein the dummy pattern has a mesh structure and, in the plan view of the display layer, overlaps the surrounding area and is separated from the plurality of light emitting areas.

8. The display device of claim 1, wherein each of the plurality of first sensing electrodes comprises:
a plurality of sensing patterns; and
a bridge pattern on a different layer than a layer that the plurality of sensing patterns are on, and electrically coupled to two adjacent sensing patterns among the plurality of sensing patterns,
wherein the plurality of antennas are on a same layer as the bridge pattern.

9. The display device of claim 8, wherein a distance between the layer that the plurality of sensing patterns are on and the display layer is less than a distance between the layer that the bridge pattern is on and the display layer.

10. The display device of claim 8, wherein the antenna layer comprises a dummy pattern separated from both the plurality of antennas and the bridge pattern, and
wherein the dummy pattern is on the same layer as the bridge pattern.

11. The display device of claim 1, wherein the sensing layer further comprises:
a plurality of sensing wirings electrically coupled to the plurality of first sensing electrodes and the plurality of second sensing electrodes, respectively; and
a plurality of sensing pads electrically coupled to the plurality of sensing wirings, respectively, and
wherein the antenna layer further comprises:
a plurality of antenna wirings electrically coupled with the plurality of antennas, respectively; and
a plurality of antenna pads electrically coupled to the plurality of antenna wirings, respectively.

12. The display device of claim 11, wherein the base layer comprises:
a first base area overlapping the plurality of light emitting areas and the surrounding area;
a second base area extending from a first edge portion of the first base area; and
a third base area extending from the second base area, and
wherein the plurality of sensing pads and the plurality of antenna pads are on the third base area.

13. The display device of claim 11, wherein the base layer comprises:
a first base area overlapping the plurality of light emitting areas and the surrounding area;
a second base area extending from a first edge portion of the first base area;
a third base area extending from the second base area;
a fourth base area extending from a second edge portion of the first base area different from the first edge portion of the first base area; and
a fifth base area extending from the fourth base area,
wherein the plurality of sensing pads are on the third base area and the plurality of antenna pads are on the fifth base area.

14. The display device of claim 11, wherein each of the plurality of sensing wirings is configured with a plurality of sensing conductive layers,
wherein each of the plurality of antenna wirings is configured with a single antenna conductive layer, and
wherein the single antenna conductive layer is on the plurality of sensing conductive layers.

15. The display device of claim 11, wherein each of the plurality of sensing wirings is configured with a first sensing conductive layer and a second sensing conductive layer on the first sensing conductive layer, and
wherein each of the plurality of antenna wirings is configured with a first antenna conductive layer on a same layer as the first sensing conductive layer, and a second antenna conductive layer on the first antenna conductive layer and on a same layer as the second sensing conductive layer.

16. The display device of claim 1, wherein a thickness of each of the plurality of antennas is greater than a thickness of each of the plurality of second sensing electrodes.

17. A display device comprising:
a display layer comprising a plurality of light emitting areas and a surrounding area around the plurality of light emitting areas in a plan view;
a sensing layer comprising:
a sensing electrode on the display layer and comprising a plurality of sensing patterns and a bridge pattern electrically coupled to the plurality of sensing patterns;
a sensing wiring electrically coupled to the sensing electrode; and
a sensing pad electrically coupled to the sensing wiring; and
an antenna layer comprising:
an antenna on the display layer and overlapping at least a portion of the plurality of sensing patterns;
an antenna wiring electrically coupled to the antenna; and
an antenna pad electrically coupled to the antenna wiring,
wherein the antenna comprises a first pattern configured to receive a signal, and a second pattern on a same layer as the first pattern, the second pattern being separated from the first pattern and grounded,
wherein the first pattern comprises a first pattern portion extending along a first direction, and a second pattern portion extending from the first pattern portion along a second direction crossing the first direction, wherein the first pattern portion is defined with a first area and a second area separated from the first area in the first direction, wherein the antenna is provided in plural, wherein the plurality of antennas comprises a first antenna and a second antenna, and wherein the second pattern portion of the first antenna extends from the first area of the first pattern portion of the first antenna, and the second pattern portion of the second antenna extends from the second area of the first pattern portion of the second antenna.

18. The display device of claim 17, wherein each of the antenna and the plurality of sensing patterns has openings, wherein the openings surround at least one of the plurality of light emitting areas in the plan view of the display layer, and wherein a slot is defined between the first pattern and the second pattern.

19. The display device of claim 17, wherein the first antenna further comprises a third pattern extending along the first direction, wherein the third pattern is arranged between the first pattern portion and the second pattern, and wherein the third pattern has a mesh structure.

20. The display device of claim 17, wherein the antenna layer further comprise a dummy pattern separated from the antenna, and wherein the dummy pattern has a mesh structure and, in the plan view of the display layer, overlaps the surrounding area and is separated from the plurality of light emitting areas.

* * * * *